United States Patent
Pinnington et al.

(10) Patent No.: US 8,101,498 B2
(45) Date of Patent: Jan. 24, 2012

(54) BONDED INTERMEDIATE SUBSTRATE AND METHOD OF MAKING SAME

(76) Inventors: Thomas Henry Pinnington, Pasadena, CA (US); James M. Zahler, Pasadena, CA (US); Young-Bae Park, Arcadia, CA (US); Charles Tsai, Arcadia, CA (US); Corinne Ladous, Pasadena, CA (US); Harry A. Atwater, Jr., South Pasadena, CA (US); Sean Olson, Santa Monica, CA (US)

( * ) Notice: Subject to any disclaimer, the term of this patent is extended or adjusted under 35 U.S.C. 154(b) by 295 days.

(21) Appl. No.: 11/408,239

(22) Filed: Apr. 21, 2006

(65) Prior Publication Data

US 2006/0255341 A1 Nov. 16, 2006

Related U.S. Application Data

(60) Provisional application No. 60/673,367, filed on Apr. 21, 2005, provisional application No. 60/682,823, filed on May 20, 2005, provisional application No. 60/700,357, filed on Jul. 19, 2005, provisional application No. 60/703,889, filed on Aug. 1, 2005, provisional application No. 60/711,416, filed on Aug. 26, 2005, provisional application No. 60/751,308, filed on Dec. 19, 2005, provisional application No. 60/762,490, filed on Jan. 27, 2006.

(51) Int. Cl.
*H01L 21/30* (2006.01)
*H01L 21/46* (2006.01)
(52) U.S. Cl. ......... 438/455; 438/458; 438/459; 257/617
(58) Field of Classification Search .................. 438/455, 438/458, 459; 257/617
See application file for complete search history.

(56) References Cited

U.S. PATENT DOCUMENTS

| | | | |
|---|---|---|---|
| 4,474,647 A | 10/1984 | Asselineau et al. | |
| 4,499,327 A | 2/1985 | Kaiser | |
| 5,013,681 A | 5/1991 | Godbey et al. | |
| 5,090,977 A | 2/1992 | Strack et al. | |
| 5,217,564 A | 6/1993 | Bozler et al. | |
| 5,231,047 A | 7/1993 | Ovshinsky et al. | |
| 5,336,841 A | 8/1994 | Adams | |
| 5,374,564 A | 12/1994 | Bruel | |
| 5,391,257 A | 2/1995 | Sullivan et al. | |
| 5,609,734 A | 3/1997 | Streicher et al. | |
| 5,637,187 A | 6/1997 | Takasu et al. | |

(Continued)

FOREIGN PATENT DOCUMENTS

EP 0 060 103 9/1982

(Continued)

OTHER PUBLICATIONS

Thompson et al., "Microwave-cut silicon layer transfer," Applied Physics Letters, 2005, 87:224103-1 to 224103-3.

(Continued)

*Primary Examiner* — Phat Cao

(57) ABSTRACT

An intermediate substrate includes a handle substrate bonded to a thin layer suitable for epitaxial growth of a compound semiconductor layer, such as a III-nitride semiconductor layer. The handle substrate may be a metal or metal alloy substrate, such as a molybdenum or molybdenum alloy substrate, while the thin layer may be a sapphire layer. A method of making the intermediate substrate includes forming a weak interface in the source substrate, bonding the source substrate to the handle substrate, and exfoliating the thin layer from the source substrate such that the thin layer remains bonded to the handle substrate.

13 Claims, 10 Drawing Sheets

Completed LED Device

U.S. PATENT DOCUMENTS

| | | | |
|---|---|---|---|
| 5,641,381 | A | 6/1997 | Bailey et al. |
| 5,710,057 | A | 1/1998 | Kenney |
| 5,720,929 | A | 2/1998 | Minkkinen et al. |
| 5,851,894 | A | 12/1998 | Ramm |
| 5,877,070 | A | 3/1999 | Goesele et al. |
| 5,882,987 | A | 3/1999 | Srikrishnan |
| 5,914,433 | A | 6/1999 | Marker |
| 5,955,749 | A | 9/1999 | Joannopoulos et al. |
| 6,010,579 | A | 1/2000 | Henley et al. |
| 6,020,252 | A | 2/2000 | Aspar et al. |
| 6,103,597 | A | 8/2000 | Aspar et al. |
| 6,121,504 | A | 9/2000 | Kuechler et al. |
| 6,130,780 | A | 10/2000 | Joannopoulos et al. |
| 6,150,239 | A | 11/2000 | Goesele et al. |
| 6,190,998 | B1 | 2/2001 | Bruel et al. |
| 6,221,738 | B1 | 4/2001 | Sakaguchi et al. |
| 6,225,192 | B1 | 5/2001 | Aspar et al. |
| 6,242,324 | B1 | 6/2001 | Kub et al. |
| 6,303,405 | B1 | 10/2001 | Yoshida et al. |
| 6,303,468 | B1 | 10/2001 | Aspar et al. |
| 6,323,108 | B1 * | 11/2001 | Kub et al. ................ 438/458 |
| 6,328,796 | B1 | 12/2001 | Kub et al. |
| 6,346,458 | B1 | 2/2002 | Bower |
| 6,429,104 | B1 | 8/2002 | Auberton-Herve |
| 6,465,327 | B1 | 10/2002 | Aspar et al. |
| 6,479,371 | B2 | 11/2002 | Noda |
| 6,497,763 | B2 | 12/2002 | Kub et al. |
| 6,504,091 | B2 | 1/2003 | Hisamatsu et al. |
| 6,703,144 | B2 | 3/2004 | Fitzgerald |
| 6,756,286 | B1 | 6/2004 | Moriceau et al. |
| 6,784,462 | B2 | 8/2004 | Schubert |
| 6,794,276 | B2 | 9/2004 | Letertre et al. |
| 6,809,044 | B1 | 10/2004 | Aspar et al. |
| 6,815,309 | B2 | 11/2004 | Letertre et al. |
| 6,867,067 | B2 | 3/2005 | Ghyselen et al. |
| 6,908,828 | B2 | 6/2005 | Letertre et al. |
| 6,936,482 | B2 | 8/2005 | Auberton-Herve |
| 6,989,314 | B2 | 1/2006 | Rayssac et al. |
| 7,019,339 | B2 | 3/2006 | Atwater et al. |
| 7,288,430 | B2 | 10/2007 | Faure et al. |
| 2003/0064535 | A1 | 4/2003 | Kub et al. |
| 2003/0213964 | A1 | 11/2003 | Flynn et al. |
| 2003/0218212 | A1 | 11/2003 | Lee et al. |
| 2004/0214434 | A1 | 10/2004 | Atwater et al. |
| 2004/0235268 | A1 | 11/2004 | Letertre et al. |
| 2005/0026394 | A1 * | 2/2005 | Letertre et al. ............ 438/459 |
| 2005/0026432 | A1 | 2/2005 | Atwater et al. |
| 2005/0032330 | A1 | 2/2005 | Ghyselen et al. |
| 2005/0059179 | A1 | 3/2005 | Erchak et al. |
| 2005/0085049 | A1 | 4/2005 | Atwater et al. |
| 2005/0142879 | A1 | 6/2005 | Atwater et al. |
| 2005/0217717 | A1 | 10/2005 | Faris |
| 2005/0275067 | A1 | 12/2005 | Atwater et al. |
| 2006/0060866 | A1 | 3/2006 | Tezen |
| 2006/0071274 | A1 | 4/2006 | Cheng et al. |
| 2006/0166390 | A1 | 7/2006 | Letertre et al. |
| 2006/0202215 | A1 | 9/2006 | Wierer et al. |
| 2006/0214225 | A1 | 9/2006 | Holt et al. |
| 2007/0175384 | A1 | 8/2007 | Bruderl et al. |

FOREIGN PATENT DOCUMENTS

| | | |
|---|---|---|
| JP | 03-270220 | 2/1991 |
| WO | WO 01/03172 A1 | 1/2001 |
| WO | WO 2005/029576 A2 | 3/2005 |
| WO | WO 2006/116030 A2 | 11/2006 |

OTHER PUBLICATIONS

Belousov et al., "In situ metrology advances in MOCVD growth of GaN-based materials," Journal of Crystal Growth, 2004, 272:94-99.

Chang et al., "GaAs/InGaAS/AlGaAs MODFETs with a very thin buffer layer and very high transconductances," Journal of Crystal Growth, 2001, 227-228:214-217.

Dadgar et al. "Reduction of stress at the initial stages of GaN growth on Si(111)," Applied Physics Letters, Jan. 6, 2003, 82(1):28-30.

Einfeldt et al., "Strain and crystallographic tilt in uncoalesced GaN layers grown by maskless pendeoepitaxy," Applied Physics Letters, Feb. 11, 2002, 80(6):953-955.

Franke et al,. "Surface quality of InP etched with tertiarybutylchloride in an MOVPE reactor," Journal of Crystal Growth, 2003, 248 :421-425.

Grzegorczyk et al., "Influence of sapphire annealing in trimethylgallium atmosphere on GaN epitaxy by MOCVD," Journal of Crystal Growth, 2005, 283:72-80.

Hsueh, Chun-Hway, "Stress distribution and curvature in graded semiconductor layers," Journal of Crystal Growth, 2003, 258:302-309.

Lavoie et al., "Indium-induced smoothing of GaAs films during MBE growth," Can. J. Phys. (Suppl.), 1996, 74:S49-S53.

Lu et al.,, "Growth of crack-free GaN films on Si(111) substrate by using Al-rich AlN buffer layer," Journal of Applied Physics, Nov. 1, 2004,96(9):4982-4988.

Mochizuki et al., "Influence of in situ HCl gas cleaning on n/p-type GaAs and AlGaAs regrown interfaces in MOCVD," Journal of Crystal Growth, 2005, 273"464-473.

Mullan et al., "Compositional variations in InGaAsP films grown on patterned substrates," Journal of Crystal Growth, 1997, 182:266-274.

Park et al., "Overgrowth on InP corrugations for 1.55 μm DFB LDs by reduction of carrier gas flow in LPMOCVD," Journal of Crystal Growth, 2003, 258:26-33.

Raghavan et al., "In situ observation of coalescence-related tensile stresses during metalorganic chemical vapor deposition of GaN on sapphire," Applied Physics Letters, 2005, 86:261907-1 to 261907-3.

Schulze et al., "Metalorganic vapor phase epitaxy grown InGaN/GaN ligh-emitting diodes on Si(001) substrate," Applied Physics Letters, 2006, 88:121114-1 to 121114-3.

Shimizu et al., "Growth of high-quality GaAs/Si films for use in solar cell applications," Journal of Crystal Growth, 2004, 265:99-106.

Tsuda et al., "GaN strain reduction by growth on compliant GaN-rich GaNP," Applied Physics Letters, 2005, 87:201916-1 to 201916-3.

Yamaguchi et al., "Analysis for dislocation density reduction in selective area grown GaAs films on Si substrates," Appl. Phys. Lett., Jan. 1, 1990, 56(1):27-29.

Yamaguchi et al., "Strain relief by In-doping and its effect on the surface and on the interface structures in (Al)GaN on sapphire grown by metalorganic vapor-phase epitaxy," Applied Surface Science, 2000, 159-160:414-420.

Yamaguchi et al., "Control of strain in GaN using an In doping-induced hardening effect," Physical Review B, Jun. 25, 2001, 64:035318-1 to 035318-5.

Zeng et al., "High-quality metamorphic HEMT grown on GaAs substrates by MBE," Journal of Crystal Growth, 2001, 227-228:210-213.

Zhang et al., "The influence of AlN buffer layer thickness on the properties of GaN epilayer," Journal of Crystal Growth, 2004, 268:24-29.

Zheleva et al.,, "Pendeo-Epitaxy versus Lateral Epitaxial Overgrowth of GaN: A Comparative Study via Finite Element Analysis," Phys. Stat. Sol., 1999, 176:545-551.

U.S. Appl. No. 11/004,808, filed Dec. 7, 2004, Atwater et al.
U.S. Appl. No. 11/193,637, filed Aug. 1, 2005, Atwater et al.
U.S. Appl. No. 11/255,194, filed Oct. 21, 2005, Atwater et al.
U.S. Appl. No. 11/357,436, filed Feb. 21, 2006, Atwater et al.
U.S. Appl. No. 60/654,523, filed Feb. 18, 2005, Atwater et al.
U.S. Appl. No. 60/657,385, filed Mar. 2, 2005, Atwater et al.

Curtis Eng et al., "Integration of the UOP/HYDRO MTO Process into Ethylene Plants," 10th Ethylene Producers' Conference, 1998, pp. 54-85.

Bett et al., III-V Compounds for Solar Cell Applications, Appl. Phys. A, 1999, pp. 119-129, vol. 69, Springer-Verlag (published online: Jun. 24, 1999).

Bruel et al., Smart-Cut: A New Silicon on Insulator Material Technology Based on Hydrogen Implantation and Wafer Bonding, Mar. 1997, pp. 1636-1641, vol. 36, Jpn. J. Appl. Phys.

Cheng et al., Electron Mobility Enhancement in Strained-Si n-MOSFETs Fabricated on SiGe-on-Insulator (SGOI) Substrates, IEEE Electron Device Letters, Jul. 2001, pp. 321-323, vol. 22, No. 7.

Dobaczewski et al., Donor Level of Bond-Center Hydrogen in Germanium, Physical Review B, 2004, pp. 245207-1-6, vol. 69.

Georgakilas et al., Wafer-scale Integration of GaAs Optoelectronic Devices with Standard Si Integrated Circuits Using a Low-Temperature Bonding Procedure, Applied Physics Letters, Dec. 2002, pp. 5099-5101, vol. 81, No. 27, American Institute of Physics [Downloaded Oct. 19, 2004].

Gösele et al., Fundamental Issues in Wafer Bonding, J. Vac. Sci. Technol. A, Jul./Aug. 1999, pp. 1145-1152, vol. 17(4), American Vacuum Society.

Gösele et al., Semiconductor Wafer Bonding. Annu. Rev. Mater. Sci., 1998, pp. 215-241, vol. 28.

Huang et al., SiGe-on-Insulator Prepared by Wafer Bonding and Layer Transfer for High-Performance Field-Effect Transistors, Applied Physics Letters, Feb. 2001, pp. 1267-1269, vol. 78, No. 9, American Institute of Physics.

Tong et al., "Layer Splitting Process in Hydrogen-Implanted Si, Ge, SiC, and Diamond Substrates," Appl. Phys. Lett., vol. 70, No. 11, Mar. 17, 1997, pp. 1390-1392.

Huang et al., Electron and Hole Mobility Enhancement in Strained SOI by Wafer Bonding, IEEE Transactions on Electron Devices, Sep. 2002, pp. 1566-1571, vol. 49, No. 9.

Langdo et al., Strained Si on Insulator Technology: From Materials to Devices, Solid-State Electronics, 2004, pp. 1357-1367, vol. 48, Elsevier Ltd.

Leroy et al., Controlled Surface Nanopatterning with Buried Dislocation Arrays, Surface Science, 2003, pp. 211-219, vol. 545, Elsevier B.V.

Ma et al., Solid-State Reaction-Mediated Low-Temperature Bonding of GaAs and InP Wafers to Si Substrates, Appl. Phys. Lett., Feb. 1994, pp. 772-774, vol. 64, No. 6, American Institute of Physics.

Maleville et al., Smart-Cut® Technology: From 300 mm Ultrathin SOI Production to Advanced Engineered Substrates, Solid-State Electronics, 2004, pp. 1055-1063, vol. 48, Elsevier Ltd.

Morral et al., InGaAs/InP Double Heterostructures on InP/Si Templates Fabricated by Wafer Bonding and Hydrogen-Induced Exfoliation, Applied Physics Letters, Dec. 2003, pp. 5413-5415, vol. 83, No. 26, American Institute of Physics.

Tong et al., Wafer Bonding and Layer Splitting for Microsystems, Adv. Mater., 1999, pp. 1409-1425, vol. 11, No. 17, Wiley-VCH Verlag GmbH.

Tong et al., Hydrophobic Silicon Wafer Bonding, Appl. Phys. Lett., Jan. 1994, pp. 625-627, vol. 64, No. 5, American Institute of Physics.

Tong et al., A "Smarter-Cut" Approach to Low Temperature Silicon Layer Transfer, Appl. Phys. Lett., Jan. 1998, pp. 49-51, vol. 72, No. 1, American Institute of Physics.

Zahler et al., Ge Layer Transfer to Si for Photovoltaic Applications, Thin Solid Films, 2002, pp. 558-562, vol. 403-404, Elsevier Science B.V.

Zahler et al., Wafer Bonding and Layer Transfer Processes for 4-Junction High Efficiency Solar Cells, 29$^{th}$ IEEE Photovoltaic Specialists Conferece, New Orleans, USA, (May 2002).

Auberton-Hervé et al., Smart-Cut®: The Basic Fabrication Process for UNIBOND® SOI Wafers, IEICE Trans. Electron, Mar. 1997, pp. 358-363, vol. E80-C, No. 3, The Institute of Electronics, Information and Communication Engineers.

Tracy et al., Germanium-on-Insulator Substrates by Wafer Bonding, Journal of Electronic Materials, 2004, pp. 886-892, vol. 33, No. 8.

Zahler et al., J. Electron Mater., 33(8), (2004), pp. 22-23, (Abstracts K2 and K3).

Akatsu et al., Wafer Bonding of Different III-V Compound Semiconductors by Atomic Hydrogen Surface Cleaning, Journal of Applied Physics, Oct. 2001, pp. 3856-3862, vol. 90, No. 8, American Institute of Physics.

Bruel M., Silicon on Insulator Material Technology, Electronics Letters, Jul. 1995, pp. 1201-1202, vol. 31, No. 14.

Bruel M., Application of Hydrogen Ion Beams to Silicon on Insulator Material Technology, Nuclear Instruments and Methods in Physics Research B, 1996, pp. 313-319, vol. 108, Elsevier Science B.V.

Kim et al., Heterogeneous Silicon Integration by Ultra-High Vacuum Wafer Bonding, Journal of Electronic Materials, 2003, pp. 849-854, vol. 32, No. 8.

Lagnado et al., Integration of Si and SiGe with $Al_2O_3$ (sapphire), Microelectronic Engineering, 2001, pp. 455-459, vol. 59, Elsevier Science B.V.

Taraschi et al., Strained Si, SiGe, and Ge On-Insulator: Review of Wafer Bonding Fabrication Techniques, Solid-State Electronics, 2004, pp. 1297-1305, vol. 48, Elsevier Ltd.

Wiegand et al., Wafer Bonding of Silicon Wafers Covered with Various Surface Layers, Sensors and Actuators, 2000, pp. 91-95, vol. 86, Elsevier Science B.V.

Yamaguchi M., Multi-Junction Solar Cells and Novel Structures for Solar Cell Applications, Physica E, 2002, pp. 84-90, vol. 14, Elsevier Science B.V.

Zahler et al., Wafer Bonded Ge/Si Heterostructures for Photovoltaic Applications, Presentation, MRS 2002 Fall Meeting, 16 pages, (Nov. 2002).

Zahler et al., Wafer Bonded Ge/Si Heterostructures for Photovoltaic Applications, (Presentation), Electronic Materials Conference 2002, 16 pages.

Zahler et al., Wafer Bonded Ge/Si Heterostructures for Photovoltaic Applications, (Abstract and Presentation), MRS 2002 Spring Meeting (Apr. 2002).

Zahler J.M., Materials Integration by Wafer Bonding and Layer Transfer, (Presentation), 13 pages, MRS 2004 Spring Meeting (Apr. 2004).

Zahler et al., The Role of H in the H-Induced Exfoliation of GE Films, (Abstract and Presentation), MRS 2004 Spring Meeting, 16 pages (Apr. 2004).

Zahler et al., Wafer Bonded Expitaxial Templates for GaAs/Si Heterostructures, (Abstract and Presentation), MRS 2003 Spring Meeting, 16 pages, (Apr. 2003).

Zahler et al., Wafer Bonded Expitaxial Templates for GaAs/Si and InP/Si Heterostructures, (Presentation), MRS 2003 Fall Meeting, 15 pages, (Nov. 2003).

Zahler et al., Wafer Bonding Processes for Ultrahigh Efficiency Photovoltaic Applications, (Presentation), MRS 2001 Fall Meeting, (Nov. 2001).

Zahler et al., GE Layer Transfer to Si for Photovoltaic Applications, (Presentation), 14 pages, MRS 2001 Spring Conference, (Jun. 31, 2001).

Zahler et al., Wafer Bonding and Layer Transfer Processes for a 4-Junction Solar Cell, (Presentation) 29$^{th}$ IEEE Photovoltaic Specialists Conference, New Orleans, USA, (May 2002), 1 pg.

Zahler et al., Ge/Si Wafer Bonded Epitaxial Templates for GaAs/Si Heterostructures, (Abstract), MRS 2002 Fall Meeting, (Nov. 2002).

Morral et al., Bonding and Layer Transfer Process of InP on Silicon for the Elaboration of the Botton Double Heterostructure of 4-Junction High Efficiency Solar Cells, (Abstract), MRS 2002 Fall Meeting, (Nov. 2002).

Morral et al., Assessment of Optical and Structural Properties of III-V Semiconductors Grown on InP/Si and Ge/Si Wafer Bonded Epitaxial Templates with Application to a Four-Junction Solar Cell, (Abstract), MRS 2003 Spring Meeting, (Apr. 2003).

Morral et al., Electrical and Structural Characterization of the Interface of Wafer Bonded InP/Si, MRS 2003 Spring Meeting, (Apr. 2003).

Morral et al., The Role of Hydrogen in H-Induced Exfoliation and Layer Transfer on InP, (Abstract), MRS 2004 Spring Meeting, (Apr. 2004).

Weldon et al., "Mechanism of Silicon Exfoliation Induced by Hydrogen/Helium Co-Implantation," Applied Physics Letters, vol. 73, No. 25, Dec. 21, 1998, pp. 3721-3723.

Nell et al, IEEE Trans. Electron. Dev., vol. 34, p. 257, 1987.

Dong-Sheng et al., 2004 Chinese Phys. Lett. 21, pp. 970-971.

Edgar, J.H. et al. Ed., chapter C2 in *Properties, processing, and applications of Gallium Nitride and Related Semiconductors* 1999, No. 23, pp. 507-529.

Han et al. "Monitoring and controlling of strain during MOCVD of AlGaN for UV optoelectronics," MRS Internet J. Nitride Semicond. Res. 4S1, G7.7, 1999, 6 pgs.

Heame et al., "Stress evolution during metalorganic chemical vapor deposition of GaN," Appl. Phys. Lett. Jan. 18, 1999, vol. 74, No. 3, pp. 356-358.

Hirayama, et. al. in "High-efficiency 352nm quaternary InAlGaN-based ultraviolet light-emitting diodes grown on GaN substrates," Japanese Journal of Applied Physics, vol. 43, No. 10A, 2004, pp. L1241-L1243.

Kamp et al., "GaN homoepitaxy for device applications," MRS Internet J. Nitride Semicond. Res. 4S1, G10.2, 1999, 12 pgs.

McCarthy et al., "GaN HBT: Toward an RF Device," IEEE Transaction on Electron Devices, vol. 48, No. 3, Mar. 2001, pp. 543-551.

Merfeld, et. al., "Influence of GaN Material Characteristics on Device Performance for Blue and Ultraviolet Light-Emitting Diodes," Journal of Electronic Materials, vol. 33, No. 11, 2004, pp. 1401-1405.

Nishida, et. al., "Highly efficient AlGaN-based UV-LEDs and their application as visible light sources," Proceedings of SPIE vol. 4641, 2002, pp. 68-75.

Raghavan et al., "Effect of AlN interlayers on growth stress in GaN layers deposited on (111) Si," Appl. Phys. Left. 87, 142101, 2005, 3 pgs.

Ren et al., "Wide Energy Bandgap Electronics" p. 59.

Tong et al., "Semiconductor Wafer Bonding: Science and Technology," 1999, pp. 1-15, 48-81, 96-123 and 132-135.

Tong, Q.Y. et. al., "Reversible Silicon Wafer Bonding for Surface Protection: Water-Enhanced Debonding," Journal of the Electrochemical Society, vol. 139, No. 11, Nov. 1992, pp. 1101-1102.

Tong et al., "Layer splitting process in hydrogen-implanted Si, Ge, SiC, and diamond substrates," Appl. Phys. Lett. 70 (11), Mar. 17, 1997, pp. 1390-1392.

Office Action mailed May 5, 2009, in copending U.S. Appl. No. 11/785,038, 23 pgs.

PCT/ISA/206 and partial International Search Report mailed Nov. 3, 2009, in corresponding PCT/US2009/051546. 7 pages.

Non-Final Office Action mailed Nov. 24, 2009, in copending U.S. Appl. No. 11/357,436, 14 pages.

* cited by examiner

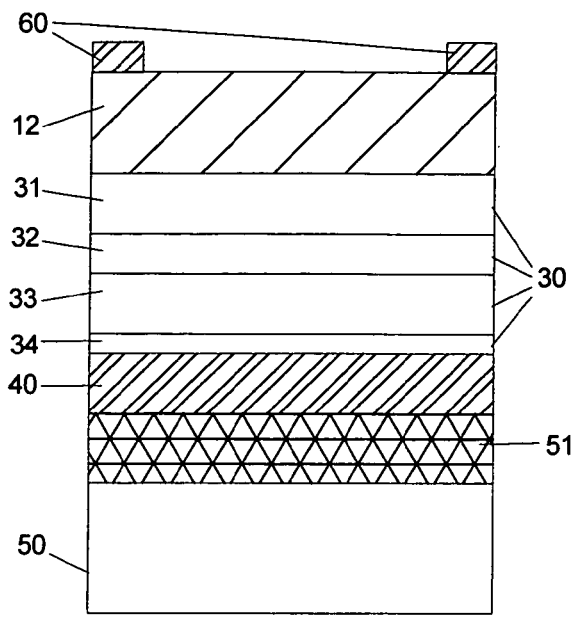
FIG. 2O: Ohmic Contact Formation
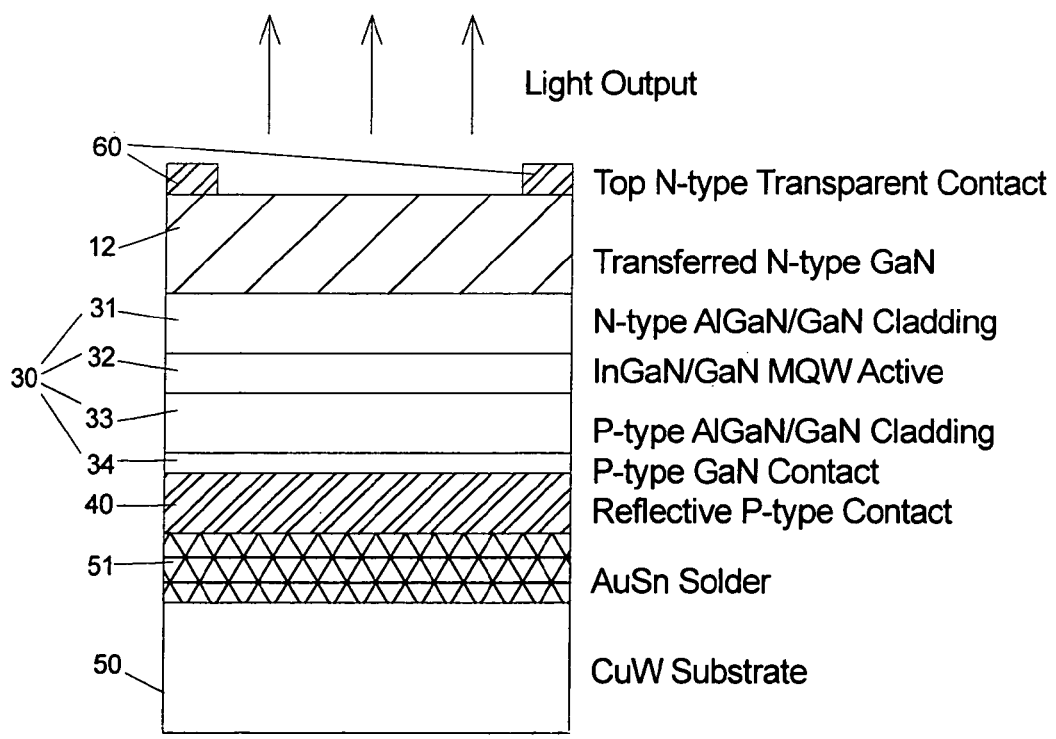
FIG. 1: Completed LED Device

FIG. 2A: GaN Substrate
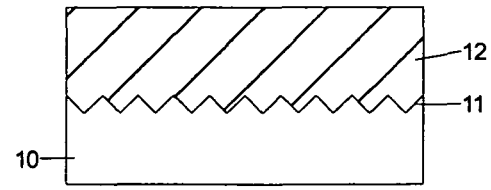
FIG. 2B: Implantation
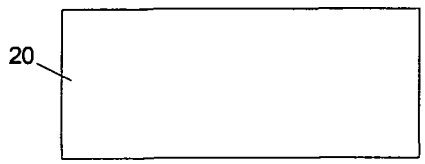
FIG. 2C: Mo Substrate
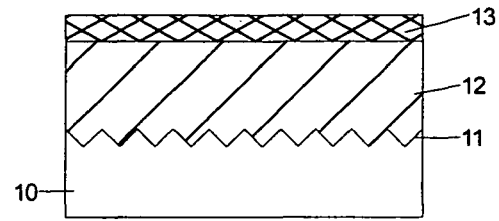
FIG. 2D: SiO2 Deposition
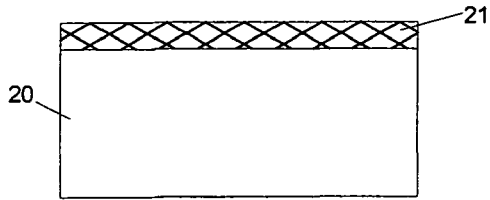
FIG. 2E: SiO2 Deposition
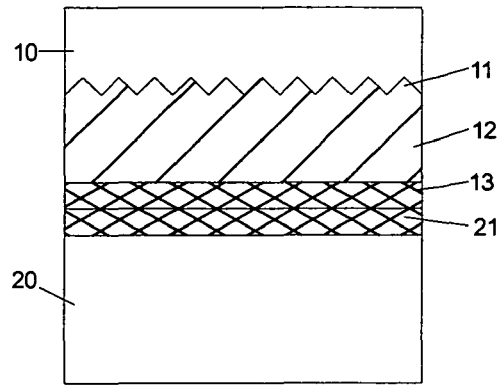
FIG. 2F: Bond Wafer
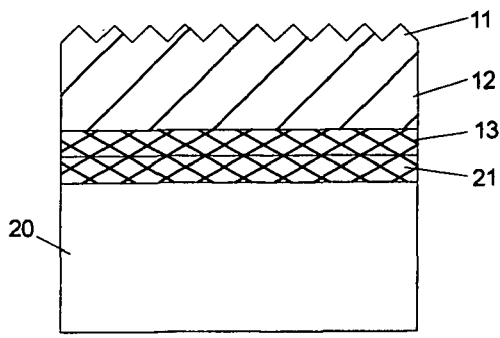
FIG. 2G: Exfoliate GaN Film
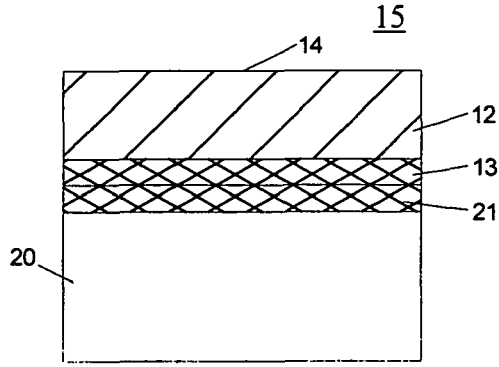
FIG. 2H: Polish Wafer

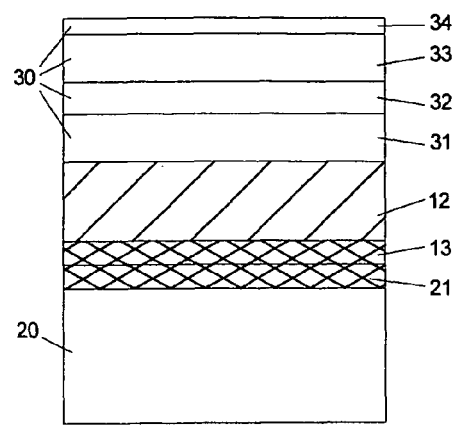
FIG. 2I: MOCVD Epitaxial Growth
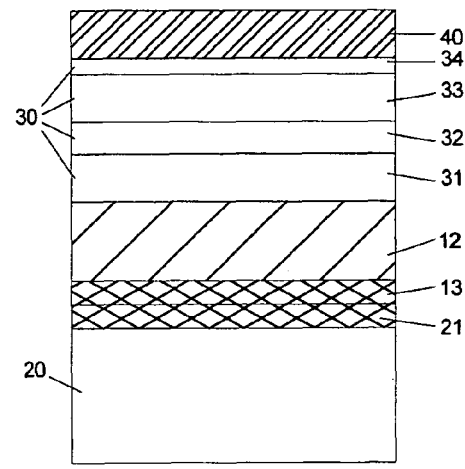
FIG. 2J: Ohmic Contact Formation
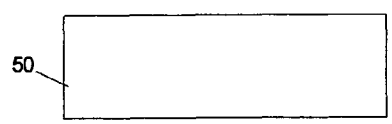
FIG. 2K: CuW Substrate
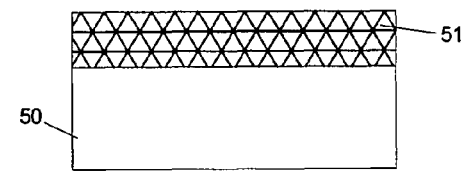
FIG. 2L: AuSn Deposition
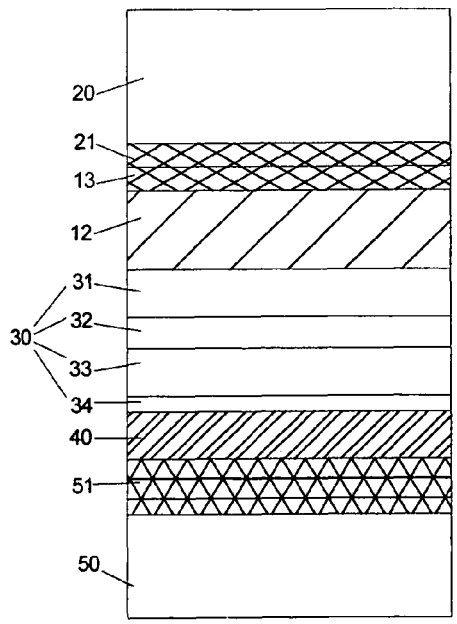
FIG. 2M: Bond Wafer
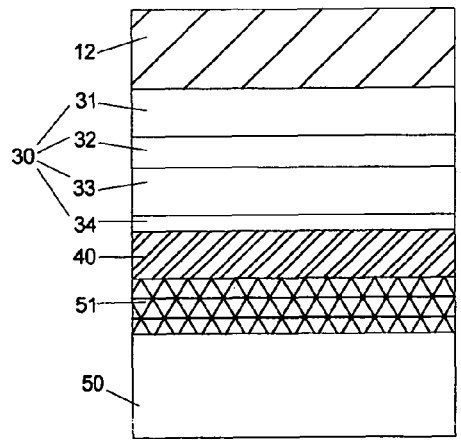
FIG. 2N: Etch

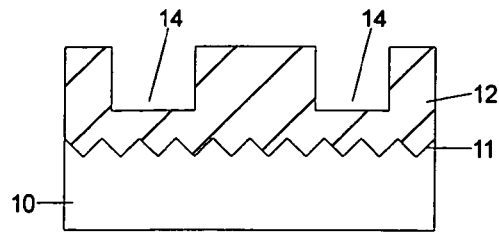
FIG. 3A: RIE Etch
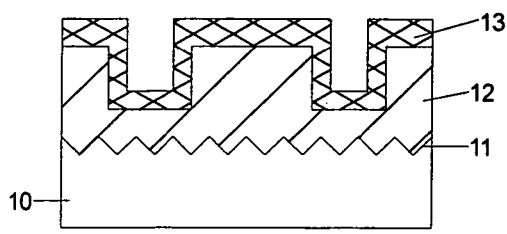
FIG. 3B: SiO2 Deposition
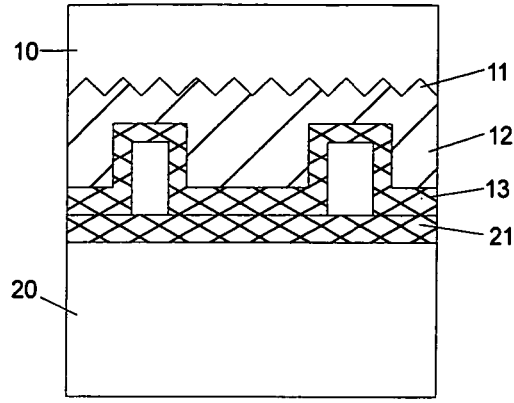
FIG. 3C: Bond Wafer
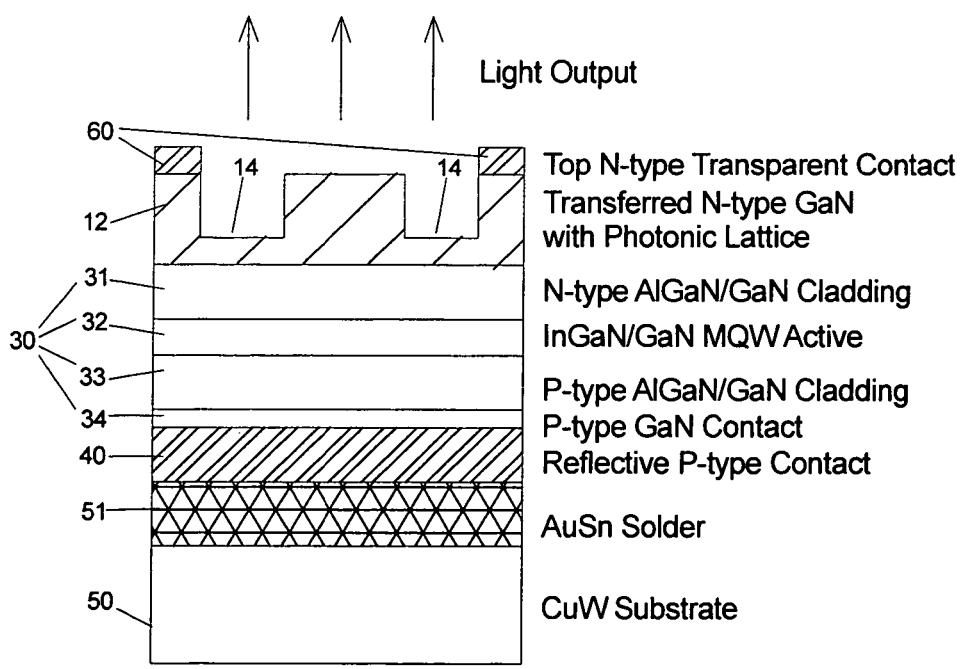
FIG. 4: Completed LED Device

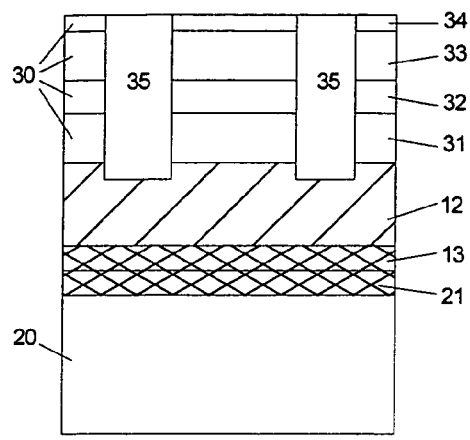
FIG. 5A: RIE Etch and Refill
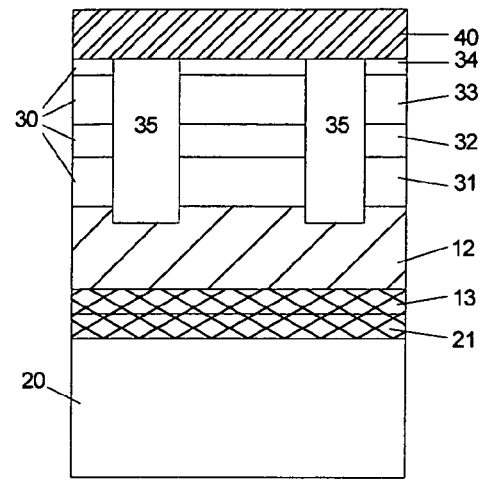
FIG. 5B: Ohmic Contact Formation
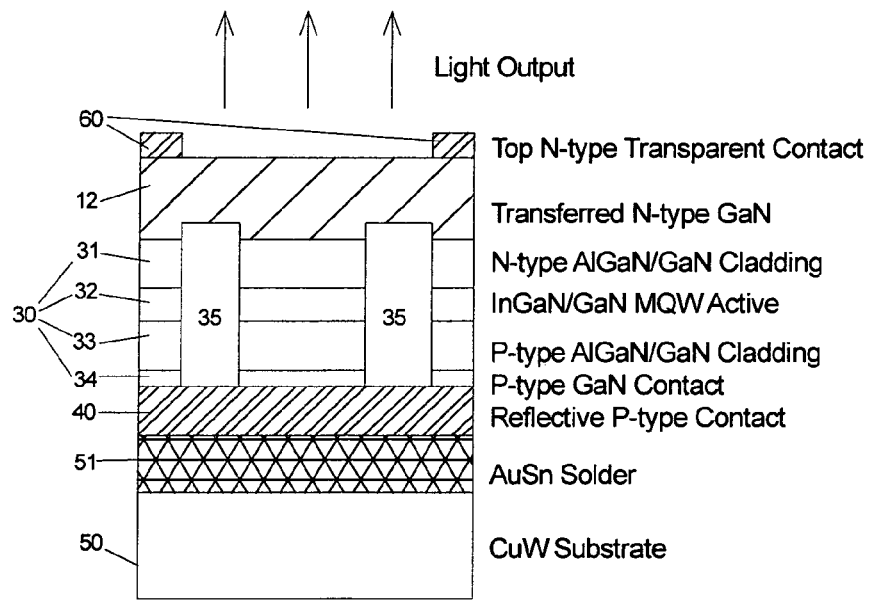
FIG. 6: Completed LED Device

BONDED INTERMEDIATE SUBSTRATE AND METHOD OF MAKING SAME

CROSS-REFERENCE TO RELATED PATENT APPLICATIONS

The present application claims benefit of priority of U.S. provisional application Ser. Nos. 60/673,367 filed on Apr. 21, 2005; 60/682,823 filed on May 20, 2005; 60/700,357 filed on Jul. 19, 2005; 60/703,889 filed on Aug. 1, 2005; 60/711,416 filed on Aug. 26, 2005; 60/751,308 filed on Dec. 19, 2005 and 60/762,490 filed on Jan. 27, 2006, all of which are incorporated herein by reference in their entirety.

FIELD OF THE INVENTION

The invention relates to an intermediate substrate which can be used for fabrication of wafer-bonded semiconductor structures used for light-emitting devices, such as light emitting diodes (LEDs), laser diodes (LDs), as well as other devices, and the structure of such devices. The invention further relates to wafer-bonded semiconductor structures fabricated with removable substrates.

BACKGROUND OF THE INVENTION

The nitride semiconductor system that includes $Al_xIn_yGa_{1-x-y}N$ is a desirable direct-bandgap semiconductor material system for light-emitting devices operating in the visible and green-blue-ultraviolet spectrum. However, nitride semiconductors are difficult and costly to produce as bulk single crystals. Therefore, hetero-epitaxial technology is often employed to grow nitride semiconductors on different material substrates such as sapphire or SiC by metal-organic chemical vapor deposition (MOCVD) or other epitaxial growth techniques, including, but not limited to hydride vapor phase epitaxy (HVPE), molecular beam epitaxy (MBE) and liquid phase epitaxy (LPE). In order to improve the crystalline quality of the grown layers, buffer layer growth at low temperature, patterning, epitaxial lateral overgrowth, or additional growth steps may be required to reduce crystal defects to levels necessary for operation of light-emitting devices. Further improvements in crystalline quality are needed to enable development of smaller light-emitting devices with longer life time, higher output power, and lower cost relative to conventional devices.

Presently, nitride semiconductor structures grown on sapphire substrates are used for conventional blue LED, green LED, ultraviolet (UV) LED, and blue LD devices. These devices have applications in a variety of devices including full-color displays, traffic lights, image scanners, solid state lighting and high-density optical storage disks.

Because sapphire has a low thermal conductivity and is electrically insulating, the functionality of nitride semiconductor structures on sapphire is limited. Both electrical contacts of the light-emitting device grown on a sapphire substrate have to be located on the top surface to form a lateral type device. This reduces the usable area of light-emission when compared to a GaN light-emitting device formed on conductive (i.e., highly doped semiconductor) substrates that require only one contact on the top surface and another contact on the substrate (i.e., a vertical type device). Because both contacts are located on the top surface in a lateral device, significant lateral current flows through the chip resulting in heating of the light-emitting device which accelerates the degradation of the device. Device manufacturers have attempted to overcome these challenges by removing the devices from the sapphire substrate following growth using techniques such as laser lift-off and physical and chemical removal of the sapphire substrate. However, these approaches present many problems, including high capital costs, resultant damage to the device layer, and low yields. The coefficient of thermal expansion of sapphire is also poorly matched to gallium nitride and its alloys. As a result, the growth of gallium nitride-based films on sapphire substrates presents challenges that scale with wafer diameter. Because of these challenges, manufacturers have found it difficult to move to larger substrate sizes despite the potential for associated cost reductions. The CTE related challenges are not addressed by post-device growth sapphire substrate removal techniques.

Recently, interest has grown in LEDs capable of emitting in the UV region (wavelength<400 nm). For LED devices emitting at wavelengths shorter than the bandgap of GaN at ~365 nm, the thick buffer layer of GaN used in conventional growth on sapphire substrate reduces the useful light output by approximately half due to absorption of light emitted from the $Al_xIn_yGa_{1-x-y}N$ active region by the narrower bandgap GaN.

Recently, researchers have made progress in the growth of III-nitride based devices, including LDs and LEDs, on freestanding GaN manufactured by HVPE. Because of the low dislocation material that is possible in freestanding GaN, devices grown on high quality freestanding GaN have demonstrated significant performance improvements over those grown on sapphire or silicon carbide as presented by T. Nishida, et. al. in "Highly efficient AlGaN-based UV-LEDs and their application as visible light sources," Proceedings of SPIE Vol. 4641 (2002), by H. Hirayama, et. al. in "High-efficiency 352 nm quaternary InAlGaN-based ultraviolet light-emitting diodes grown on GaN substrates," Japanese Journal of Applied Physics, Vol. 43, No. 10A, 2004, or by D. W. Merfeld, et. al. in "Influence of GaN material characteristics on device performance for blue and ultraviolet light-emitting diodes," Journal of Electronic Materials, Vol. 33, No. 11, 2004. However, for this approach to be commercially viable, it is necessary to reduce the cost of the freestanding GaN material used in the devices. For LEDs, it is also necessary to develop techniques for reducing the thickness of the conductive GaN substrate within the final device structure to reduce free-carrier absorption in the substrate and unwanted emission from the sides of the substrate. At present, thinning of freestanding GaN substrates in the finished device structure is not viable due to the very high cost of the freestanding GaN substrate and the difficulty of controllably and selectively removing the thick (typically >200 μm thick) GaN substrate without damaging the thin device structure (typically <5 μm thick).

SUMMARY OF THE INVENTION

One embodiment of the invention provides an intermediate substrate which includes a handle substrate bonded to a thin layer suitable for epitaxial growth of a compound semiconductor layer, such as a III-nitride semiconductor layer. The handle substrate may be a metal or metal alloy substrate, such as a molybdenum or molybdenum alloy substrate, while the thin layer may be a sapphire layer. Another embodiment of the invention provides an intermediate substrate comprising a thin layer suitable for epitaxial growth of a compound semiconductor material bonded to a handle substrate having a coefficient of thermal expansion which is closely matched to a coefficient of thermal expansion of the compound semiconductor material. Another embodiment of the invention provides a method of making the intermediate substrate which includes forming a weak interface in the source substrate, bonding the source substrate to the handle substrate, and exfoliating the thin layer from the source substrate such that the thin layer remains bonded to the handle substrate. Another embodiment of the method describes a method for making freestanding substrates using intermediate substrates.

BRIEF DESCRIPTION OF THE DRAWINGS

Further features of the invention, its nature and various advantages will be more apparent from the following detailed description in conjunction with the accompanying drawings in which like reference characters refer to like parts throughout, and in which:

FIG. 1 is a side cross-sectional view of a device according to one preferred embodiment of the present invention.

FIGS. 2A to 2O are side cross-sectional views of a method of making a device according to embodiments of the present invention.

FIGS. 3A to 3C are side cross-sectional views of a method of making a device with a photonic lattice structure according to an embodiment of the present invention.

FIG. 4 is a side cross-sectional view of a device with a photonic lattice structure according to one embodiment of the present invention.

FIGS. 5A to 5B are side cross-sectional views of a method of making a device with a photonic lattice structure according to an alternative embodiment of the present invention.

FIG. 6 is a side cross-sectional view of a device with a photonic lattice structure according to an alternative embodiment of the present invention.

DETAILED DESCRIPTION OF THE PREFERRED EMBODIMENT

Figure 7:
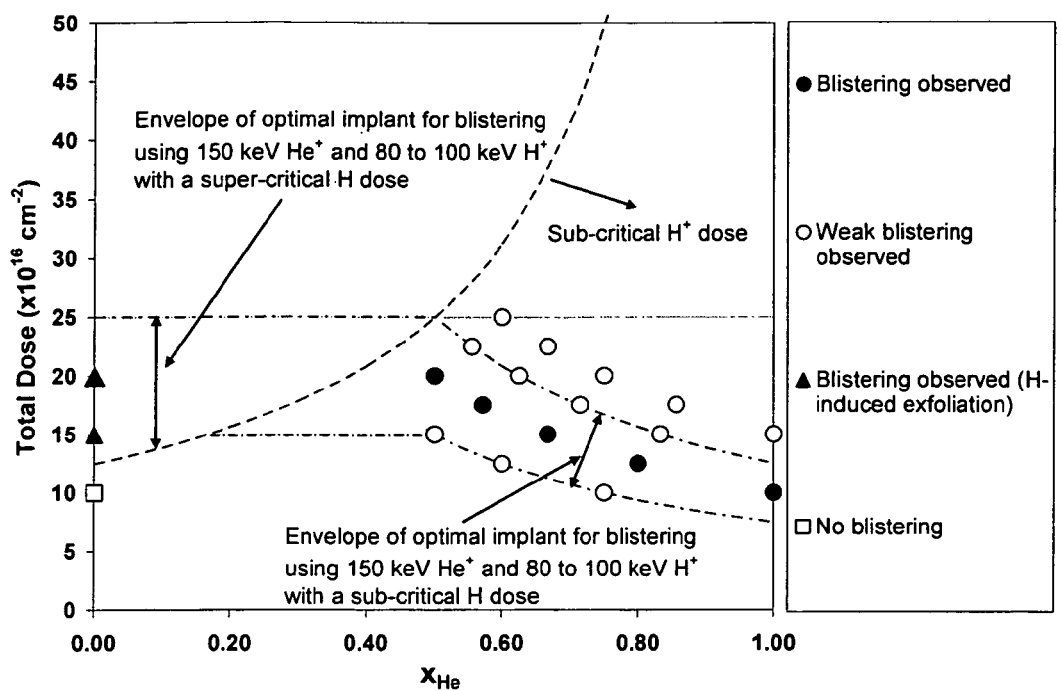
FIG. 7 is an implantation phase diagram for the He/H co-implantation-induced exfoliation of sapphire. The Figure shows a preferred envelope of dose combinations for He/H co-implantation.

The fabrication and structure of semiconductor-based light-emitting devices with high brightness and high efficiency and other devices are described. The devices are grown on an intermediate substrate after the intermediate substrate is formed by wafer bonding. The wafer-bonded intermediate substrate is comprised of a handle substrate and a thin layer of semiconductor or ceramic material that has been transferred from another semiconductor or ceramic substrate. Preferably, the coefficient of thermal expansion of the handle material is closely matched to the coefficient of thermal expansion (CTE) of the device layers over a temperature range. Preferably, the thin layer comprises a single-crystalline semiconductor or ceramic material exfoliated from a high-quality low-defect-density freestanding single-crystalline semiconductor or ceramic substrate. The wafer-bonded intermediate substrate improves the crystalline quality of high-temperature epitaxial growth by providing efficient thermal coupling to the wafer susceptor used in epitaxial growth systems and minimizing the strain induced in the grown material relative to other approaches. The wafer-bonded intermediate substrate also enables the use of larger diameter substrates for the growth of device films than is possible with other approaches in cases where the CTE of the material upon which devices will be formed is significantly different from the CTE of the device layer, for example, in the case where III-nitride films are grown on sapphire. The devices grown on the intermediate substrate are integrated with a final substrate, preferably by wafer bonding. The intermediate substrate may be removed by a process such as etching while the device structure remains bonded to the final substrate without damaging the device layer. The removal of the intermediate substrate simplifies the fabrication of vertical device structures with front- and back-side contacts (in a vertical device, the contacts are located on opposite sides of the device, while in horizontal devices, the contacts are located on the same side of the device; both vertical and horizontal devices may be made by the processes described herein). In cases where a thin GaN or III-nitride film acts as a template for the growth of the device film, the removal of the bulk of the intermediate substrate simplifies the production of thin light-emitting structures, which improves the external quantum efficiency by reduced lateral waveguiding of light output and decreased optical loss from free carrier absorption in conductive doped semiconductor material. Additionally, materials or structures with high optical reflectivity can be integrated in the finished light-emitting device structure to improve light-extraction efficiency. Photonic lattice structures can also be optionally integrated into the light-emitting device structure to further improve efficiency. Furthermore, the intermediate substrate for epitaxial growth of III-nitride and other compound semiconductor or ceramic layers of the embodiments of the invention can be made larger than the commercially available substrates, thus decreasing the cost of device manufacturing.

The structures and approach are applicable to wide range of electronic devices including, but not limited to, optoelectronic devices, high frequency amplifiers, HEMTs, HBTs, and solar cells. In some cases, the intermediate substrates may also form the final support substrate. For the following embodiment, specific examples using III-nitride semiconductors are described. It is to be understood that equivalent substitution using $Al_xIn_yGa_{1-x-y}N$ on AlN/$AlGa_{1-z}N$ material in place of the $Al_xIn_yGa_{1-x-y}N$ on GaN material can be applied easily with the disclosure provided herein, and where x, y, x+y and z range between zero and one. In addition, it is to be understood that the substrate structures and associated manufacturing techniques for the substrates and devices can be applied to a wide range of other electronic devices. Any other semiconductor device fabricated by a form of epitaxy in which the final device can benefit from integration of the finished structure with a package that is unsuitable for epitaxy, such as a metallic mounting for high power devices or a transparent cover glass for photovoltaic (PV) devices, may benefit from the use of a wafer-bonded intermediate substrate comprising a thin semiconductor or ceramic layer on a removable handle substrate. A representative, but not exhaustive, list of materials for transfer and their applications comprises Ge for growth of III-V compound semiconductor PV devices, InP for optoelectronic, electronic, and PV applications, and GaAs for optoelectronic, electronic, and PV applications. Thus, while the method described herein illustrates formation of intermediate substrates for III-nitride semiconductor devices, the intermediate substrates may be used for other semiconductor devices, such as other III-V, II-VI, Ge and/or SiC devices, and other solid state devices containing thin non-semiconductor single crystal or ceramic layers.

Referring to FIG. 1, the semiconductor-based light-emitting device, such as an LED, of one embodiment of the invention includes a final substrate 50, bonding layer 51, first terminal contact 40, light-emitting semiconductor active layers 30 including one or more semiconductor layers 31, 32, 33, 34, thin transferred semiconductor layer 12, and a second terminal contact 60. If desired, the thin transferred semiconductor layer 12 can optionally be removed from the finished device structure by mechanical or chemical means following fabrication of the epitaxial device structure and integration of the device with the final substrate 50. Thus, thin layer 12 can be omitted from the final device. The thin transferred semiconductor layer 12, semiconductor active layers 30, and/or first terminal contact 40 optionally comprise photonic lattice structure or random or periodic grating pattern to enhance light output in the vertical direction or to provide a frequency selective element for light-emitting device structures comprising the semiconductor-based light-emitting devices such as distributed-feedback (DFB) or distributed Bragg reflector (DBR) laser diodes. In addition, the first terminal contact 40 preferably comprises optically-reflective layers and barrier layers, for example the omni-directional reflective structures as disclosed in U.S. Pat. Nos. 6,130,780 and 6,784,462, incorporated herein by reference, to provide for higher light-extraction efficiency and better stability and reliability of the light-emitting device.

When the final device substrate 50 is electrically conductive, it can provide the semiconductor device structure with an opposed terminal structure (i.e., a vertical light-emitting device). More specifically, when the second terminal contact 60 is an n-type terminal, it can improve the light-extraction efficiency. An n-type layer in the III-V semiconductor (especially GaN semiconductor) has low resistance, and therefore the size or surface area of the n-type terminal, the second terminal 60, can be minimized when contact layer material 60 is not transparent (i.e., it only covers a portion of the semiconductor layer 12 to allow light to be emitted through the uncovered portions of layer 12). Because minimizing the size of the n-type terminal reduces the light-blocking area, this can improve the light-extraction efficiency. Alternatively, a transparent contact material, for example indium tin oxide (ITO) for p-type terminal or ZnO:Al (AZO) or ZnO:In (IZO) for n-type terminal, can also be used as second terminal contact 60. This would allow large current flow without high spreading resistance in either p-type or n-type semiconductor. For n-type nitride semiconductor contact, it is also preferable to include Al, such as Ti—Al or W—Al for example, in the second terminal contact 60.

Source Material Preparation

Detailed processing techniques and structures in accordance with embodiments of the present invention are illustrated in FIGS. 2A-2O, 3A-3C, 5A, and 5B. FIGS. 2A-2O illustrate a method of the first embodiment. In FIG. 2A, a source (also known as "donor") semiconductor substrate or wafer 10 is preferably high-quality low-defect-density freestanding commercial GaN substrate, where dislocation-defect density is less than $10^8/cm^2$. Other preferred candidates for source wafer 10 comprise one or more layers of GaN or $Al_zGa_{1-z}N$ materials grown homo-epitaxially on high-quality low-defect-density freestanding commercial GaN or AlN substrates, where z is in the range of 0 to 1. Other possible candidates for source wafer 10 comprise one or more layers of GaN or $Al_zGa_{1-z}N$ materials grown heteroepitaxially on sapphire or SiC substrates. These hetero-epitaxially grown materials have higher dislocation-defect density, typically higher than $10^8/cm^2$.

Alternatively, as will be described with respect to the second, third and fourth embodiments, any material suitable for use as an epitaxial template for the III-nitride semiconductor system may be applied as source wafer 10 for transfer of a thin layer to a handle substrate 20. This includes the transfer of a thin layer of sapphire from a sapphire substrate to a handle substrate by ion-implantation, preferably by wafer bonding of the sapphire substrate to the handle substrate and exfoliation of the thin sapphire layer to leave the thin sapphire layer bonded to the handle substrate. Additional suitable materials for transfer to a handle substrate and for subsequent use as III-nitride semiconductor epitaxial template comprise SiC, Si(111), ZnO, GaAs substrates, or any other crystalline material that can be used as a growth surface for GaN and its related compounds.

In FIG. 2B, the source wafer 10 is treated to produce a thin layer 12 with a weak interface 11 to enable transfer of the thin layer 12. Preferably the thin layer 12 with the weak interface 11 is produced by ion implantation or ionic bombardment with hydrogen, helium, nitrogen, fluorine, oxygen, boron and/or other ions. More preferably, the thin layer 12 with weak interface 11 is produced by co-implantation of hydrogen and other heavier ions as known in the art, including, but not limited to helium, nitrogen, and/or boron. Preferably, helium, or more generally, a light gas ion, can be implanted in the GaN source wafer 10 prior to implantation of hydrogen. However, implantation with $H^+$ as the first ion can also be used. The ion energies of the helium and hydrogen are selected to ensure that the concentration peaks of the helium and hydrogen are at similar depths. In this process, implantation profile peak positions varying by 10% or less can be expected to behave similarly. As-exfoliated thin layer 12 produced by ion implantation or ionic bombardment have thickness variation much less than 20% of the total thickness of thin layer 12, usually less than 10%. Thickness uniformity of thin layer 12 ensures uniformity of thermal conduction and growth temperature during epitaxial growth and produces epitaxial layers with exemplary uniformity of composition and thickness, critical for the economic production of high-performance devices with higher yield and lower costs.

Other possible processing techniques to exfoliate and transfer a thin layer 12 comprise using a sacrificial layer as the weak interface 11 that can be laterally selectively etched to allow what is commonly referred to as epitaxial lift-off (ELO). The selectively-removable weak interface used in ELO 11 can be fabricated by epitaxial growth of a thin film or ion implantation with a heavy ion to amorphize the sacrificial layer 11.

Thus, the thin layer 12 can be made of any material which supports epitaxial growth of a desired compound semiconductor material, such as a III-nitride compound semiconductor material, including GaN. Preferably, the thin layer 12 is a single crystalline layer or a layer with a highly oriented columnar structure which has a surface lattice structure which is similar to the lattice structure of the desired compound semiconductor material, such as the III-nitride compound semiconductor material, to allow epitaxial growth of a single crystal layer of the desired compound semiconductor material, such as the III-nitride compound semiconductor material, on the thin layer 12.

Source Material for Transferring a Thin GaN Layer

When freestanding GaN substrates are used, devices are typically grown on the Ga-terminated face of the GaN substrate leaving the much less chemically stable N-terminated face of the GaN substrate exposed. The relatively low chemical stability of the N-terminated GaN face makes devising a selective etch extremely difficult.

If the source substrate 10 is comprised of freestanding GaN or any other freestanding III-nitride material and the device to be fabricated on the wafer-bonded intermediate substrate comprises a LED or LD structure, it is preferable for subsequent processing that the N-face be treated to generate the weak interface 11. By treating the N-face of the source wafer 10, upon bonding and layer transfer described below, the Ga-face in GaN and the cation face in any other III-nitride freestanding material is presented for the epitaxial growth of the device structure. Although most freestanding GaN substrates available now comprise flat surfaces of the (0001) Ga-face or (000-1) N-face, other freestanding GaN substrates are also possible comprising flat surfaces of (11-20) or (10-10) planes, more commonly known as non-polar or semi-polar faces of GaN. When applied as source substrate 10, these freestanding GaN substrates comprising non-polar or semi-polar faces do not require the special distinction necessary for the Ga-face and N-face and greatly simplify the treatment of the source substrate 10.

It is known in the art that metal-organic chemical vapor deposition (MOCVD), the dominant device growth technique for III-nitride-based light-emitting devices, produces far superior epitaxial layers on the Ga- or cation-face, as shown in "GaN homoepitaxy for device applications" by M. Kamp, et. al., MRS Internet J. Nitride Semicond. Res. 4S1, G10.2 (1999). Because the HVPE growth of the freestanding III-nitride source wafer 10 results typically in a Ga-face top surface, the N-face of the resulting freestanding GaN substrate is closer to the initial growth substrate comprising sapphire or other substrates suitable for GaN growth used to fabricate the freestanding GaN, and has a higher dislocation density than the Ga-face of the freestanding GaN, as shown in "Wide Energy Bandgap Electronics" by F. Ren and J. C. Zolper, pg. 59. For this reason, it may be desirable to fabricate source wafer 10 specifically designed for the subsequent transfer of thin GaN layers 12 to produce wafer-bonded intermediate substrates intended for use as high-quality growth templates for III-nitride semiconductor. Such a freestanding GaN substrate specifically designed for the fabrication of a wafer-bonded intermediate substrate by implantation and exfoliation of thin GaN layers 12 from the N-face would be distinguished from a standard freestanding GaN substrate by being grown to a greater thickness than typical HVPE freestanding GaN substrates. The increased thickness would be used to polish an increased quantity of the material from the N-face and to move the N-face of the freestanding GaN substrate farther from the highly defective nucleation region present at the original sapphire-GaN interface in the HVPE fabrication of freestanding GaN. Specifically, greater than 50 μm, such as 50 to 200 μm of GaN should be removed from the N-face by polishing or other removal means.

Further improvement of the freestanding GaN substrate for fabrication of wafer-bonded intermediate substrates could be achieved by using a wafer-bonded intermediate substrate comprising a thin GaN film bonded to a removable handle substrate as the initial growth substrate for the HVPE growth of thick GaN. In this way the N-face of the resulting substrate would effectively be moved further from the surface of the sapphire initial growth substrate. Such a process could be repeated several times to reduce the dislocation density in the GaN film in a wafer-bonded intermediate substrate to a desired level. Additionally, a freestanding GaN substrate specifically designed for the fabrication of a wafer-bonded intermediate substrate preferably has a better polished N-face surface than what is typically specified or available in conventional HVPE freestanding GaN prepared for subsequent growth on the Ga-face. Specifically, the N-face polish preferably results in a N-face surface with less than 1 nm, preferably between 0.3 and 0.5 nm, of micro-roughness. In the case that the device to be fabricated on the wafer-bonded intermediate substrate is a HEMT or other high-power or high-frequency device, it is possible and sometimes desirable to fabricate such structures by growth with MBE on the N-face of the III-nitride material, typically GaN. For this reason, implantation of the Ga-face of the freestanding GaN substrate would be desired and can be used to transfer thin GaN layers from a freestanding GaN substrate.

Through the co-implantation of helium and hydrogen, the exfoliation process is improved relative to implantation with hydrogen alone. The improvement of the exfoliation kinetics relative to a hydrogen implantation process can be exhibited in multiple ways. The total dose of hydrogen plus helium necessary to achieve an exfoliation process that occurs at the same temperature and rate as a hydrogen-only exfoliation process is reduced. As a result, by using a total dose at the same level as a functioning hydrogen-only exfoliation process, the rate at which exfoliation occurs at a given temperature is accelerated. This can enable the reduction of the required temperature in the exfoliation process.

The use of a He/H co-implantation process introduces less total hydrogen in the transferred GaN film, reducing the amount of hydrogen available to diffuse into the device structure during high temperature epitaxial growth. By reducing the background concentration of hydrogen in the device structure, problems associated with dopant passivation—particularly Mg in p-type GaN—can be reduced relative to devices fabricated on GaN films exfoliated with a higher dose of hydrogen used in a hydrogen-only exfoliation process.

Additionally, the use of a He/H co-implantation process leads to a mechanistically different exfoliation process. The co-implantation exfoliation process improves upon the hydrogen-only exfoliation process because of the differing interactions of helium and hydrogen with the GaN crystal lattice both as energetic ions and neutral atomic species. By virtue of their larger mass and associated momentum, energetic helium ions cause an order of magnitude more damage in the crystal lattice during the implantation process than hydrogen ions of comparable energy. Furthermore, after coming to rest in the crystal lattice, helium atoms have a lower diffusivity than hydrogen atoms, and are thus less mobile under low-temperature (<500° C.) dynamic annealing that occurs during implantation. However, in contrast to hydrogen, helium atoms in the gallium nitride lattice do not bind to the defect structures formed by ion implantation. Thus, the temperature dependence of helium diffusion is dictated by the temperature dependence of helium diffusivity in the GaN crystal structure irrespective of damage, while the temperature dependence of hydrogen diffusion for hydrogen atoms bound to defect structures is a function of both the energy required to release the hydrogen from the structure, which can be quite high for nitrogen-hydrogen bonds, and the temperature dependent diffusivity of hydrogen in the GaN lattice. Thus, the hydrogen passivates and stabilizes defect structures. These defect structures lead to the formation of micro-cracks and the eventual exfoliation of the GaN film upon the diffusion of helium to the micro-crack structures at elevated temperatures (>300° C.). The net effect of the mechanistic difference is that the impact of implant temperature is minimized from a diffusion perspective making the implantation process more robust.

It has been observed that implantation of GaN at an elevated temperature leads to an improved exfoliation process when He/H co-implantation is used. The proposed mechanism for this observation is that the elevated substrate temperature during implant causes dynamic annealing to limit the buildup of lattice damage during the high dose implant necessary to exfoliate GaN. To maintain a high substrate temperature, such as a temperature above room temperature, preferably a temperature greater than 150° C., and more preferably 300 to 500° C., during implantation, several methods can be employed, comprising the following methods. The energetic ion beam delivers power to the implanted substrates that is predominantly dissipated as heat. Thus, by thermally isolating the substrates from the implanter end station, by securing the substrate with limited points of thermal contact so as to make the predominant cooling mechanism be a radiation process or by placing a thermally insulating material between the substrate and end station during implantation, the substrate temperature naturally rises during the implantation process until the substrate cooling mechanism becomes dominated by radiation rather than thermal conduction. Alternatively, directly heating the substrate during implantation by a resistive heater and a feedback control system can be used to more precisely control the temperature at the substrate surface during implantation. Thus, the substrate may be heated passively and/or actively during the implantation.

A substantial blistering and exfoliation of a GaN layer from a GaN-on-sapphire substrate and/or a freestanding GaN substrates can occur when the substrate is co-implanted with $He^+$ at an energy of 80 to 160 keV to a dose of $1.5 \times 10^{17}$ to $4.0 \times 10^{17}$ $cm^{-2}$ and $H^+$ at an energy of 60 to 100 keV to a dose of $1.0 \times 10^{17}$ to $2.0 \times 10^{17}$ $cm^{-2}$. Alternatively, $H_2^+$ ions can be used instead of $H^+$ ions by doubling the energy and halving the dose of the desired $H^+$ implant process. The desired dose for exfoliation is consistent for a wide range of implantation temperatures from passively cooled implantation resulting in a wafer temperature between room temperature and 150° C. and actively heated resulting in wafer temperatures in excess of 300° C. during implantation. Generally, the required dose for exfoliation is reduced by implantation at an elevated temperature. In all cases, the He fraction of the implant is preferably more than 50% of the total dose, up to a He-only exfoliation process that has been found to be possible for implantation doses above $3.5 \times 10^{17}$ $cm^{-2}$. Thus, the low $H^+$ doses and implant conditions described above are not sufficient to cause exfoliation in the absence of the $He^+$ implant. The substrate is annealed for >10 seconds at a temperature between 300 and 900° C. to exfoliate the layer, depending on the dose of the implant. Preferably, the GaN substrate is annealed to a temperature from 350 to 600° C. to induce exfoliation. In cases where a co-implantation process is used, an anneal between the first and second implantation may be used to improve the kinetics of the exfoliation process.

Source Material for Transferring a Thin Sapphire Layer

In brittle semiconductors, such as Si, it is generally accepted that H-induced exfoliation proceeds by the formation of damage and the super-saturation of the lattice with H during implantation that after bonding and annealing leads to laterally extended micro-cracks that coalesce to induce exfoliation. The exfoliation process in sapphire is mechanistically different than that for brittle semiconductors. For reasons related to the relatively rigid elastic properties of sapphire and its resistance to implantation damage and diffusion of implanted species, full spontaneous exfoliation of free sapphire surfaces has not been reported in the literature. Instead, subsurface blisters may not fully coalesce. Thus, the implantation and thermal cycling commonly used in implantation-induced exfoliation processes may not by themselves be sufficient for full layer exfoliation. In this case, the presence of a rigid handle substrate with a CTE that is different from that of the implanted sapphire can serve to improve the exfoliation process by inducing thermo-mechanical stresses that drive fracture and exfoliation of the material in the areas weakened by the un-coalesced subsurface blisters. This could lead to several important differences when exfoliating sapphire and developing a suitable implant process for wafer bonding and layer transfer. First, it may be important to provide either an internal thermo-mechanical stress or an external stress to serve as a driving force to induce exfoliation along the weakened interface. Additionally, adequate implantation processes to lead to exfoliation of a sapphire thin film during wafer bonding and layer transfer can be indicated by uniform blistering of a free surface upon annealing rather than the spontaneous exfoliation of the implanted film from the surface.

Sapphire blistering that leads to exfoliation and layer transfer is caused by the implantation of $He^+$ and/or $H^+$ or $H_2^+$ and has been investigated. $He^+$ ions have been implanted at energies of 80, 150, 180, and 285 keV. $H^+$ ions have been implanted at energies of 50, 80, 95, 100, 150, and 180 keV, and $H_2^+$ ions have been tested at an energy of 300 keV. For He-only exfoliation doses of $1.0 \times 10^{17}$, $1.15 \times 10^{17}$, and $1.5 \times 10^{17}$ $cm^{-2}$ were tested. For H-only exfoliation doses of $1.0 \times 10^{17}$, $1.5 \times 10^{17}$, $1.8 \times 10^{17}$, and $2.0 \times 10^{17}$ $cm^{-2}$ were tested. For co-implantation of $He^+$ and $H^+$ ions a wider range of implantation ranges and combinations was attempted with the $He^+$ dose ranging from $7.5 \times 10^{16}$ to $2.0 \times 10^{17}$ $cm^{-2}$ and $H^+$ dose ranging from $5.0 \times 10^{16}$ to $2.0 \times 10^{17}$ $cm^{-2}$.

Based upon this data, a generalized He/H co-implantation process is defined. Broadly, the blistering process is functional for $He^+$ implantation at an energy from 80 to >285 keV at a dose of $7.5 \times 10^{16}$ to $2.0 \times 10^{17}$ $cm^{-2}$ with a corresponding energy and dose for $H^+$ in the range of 50 to >150 keV and 0 to $1.25 \times 10^{17}$ $cm^{-2}$ dose. In other words, $He^+$ ions may be implanted alone or in combination with hydrogen ions. Implantation of $H^+$ at 80 keV to a dose in excess of $1.25 \times 10^{17}$ $cm^{-2}$ leads to exfoliation even in the absence of He species, and thus can not be considered a sub-critical $H^+$ dose. Appropriate implantation conditions for 150 keV $He^+$ and 80 keV $H^+$ can be expressed as a total dose, D, and the fractional component of that dose that is made up of $He^+$, $x_{He}$. Using this notation, the $H^+$ dose restriction for a sub-critical $H^+$ dose preferably leads to the following constraint for a 150 keV $He^+$ implantation process.

$$(1-x_{He})D \leq 1.25 \times 10^{17} cm^{-2} \tag{1}$$

However, operation with a sub-critical dose of $H^+$ is not essential to drive the exfoliation process. This is illustrated in FIG. 7. While weak blistering is observed for a wide range of implant conditions with 150 keV $He^+$, blistering was preferably achieved for doses defined by the following range, subject to the restriction defined in equation 1.

$$5.0 \times 10^{16} cm^{-2} \leq x_{He}D < 1.5 \times 10^{17} cm^{-2} \tag{2}$$

A summary of the data used to derive these relationships is reproduced in FIG. 7. As was noted in the previous paragraph the prescribed dose may be insufficient to cause exfoliation of a full thin film without bonding to a handle substrate with a CTE that differs from sapphire.

FIG. 7 also illustrates a window for implantation that consists of a super-critical H range where the fraction of hydrogen in the implant could produce exfoliation in the absence of the co-implanted He. In fact, this condition ranges all the way down to a H-only exfoliation process. The window for implantation ranges up to $2.5 \times 10^{17}$ $cm^{-2}$ and down to the limit defined by equation 1, with the modification that the dose window is defined for the range of the product $(1-x_{He})D$ being greater than $1.25 \times 10^{17}$ cm$^{-2}$.

A high energy implant is preferably used for transfer of sapphire onto molybdenum, aluminum nitride, or other lower CTE materials as compared to sapphire, in order to create a thin transferred layer that is sufficiently mechanically robust that it does not buckle once the high pressure bond step is complete. In sapphire layer transfer, this buckling can be driven by a number of factors as described next.

First, as a result of using a high implantation dose for sapphire for layer transfer, the damaged region in the upper part of the thin transferred layer following layer transfer but prior to damage removal is under a high degree of compressive stress relative to the lower undamaged portions of the thin transferred layer. As a result, there is a significant stress gradient from the top surface of the thin transferred layer to the bottom bonded region. This stress gradient results in an energy potential that can drive buckling in the thin transferred layer.

Second, sapphire's high modulus can result in non-uniformities in the bond strength between the sapphire thin layer and the handle substrate. These non-uniformities are caused by failure of the sapphire source substrate to flex and match the shape of the underlying handle substrate.

Preferably, the transferred sapphire layer thickness is about 800 nm or greater, such as 800 nm to 1200 nm. Other thicknesses can also be used. An 800 nm thin transferred layer is sufficiently thick to prevent buckling. This 800 nm thin layer is approximately 200 nm thicker than what would be required to generate a film of target thickness 300 nm with a 300 nm buffer for damage removal.

Figure 8:
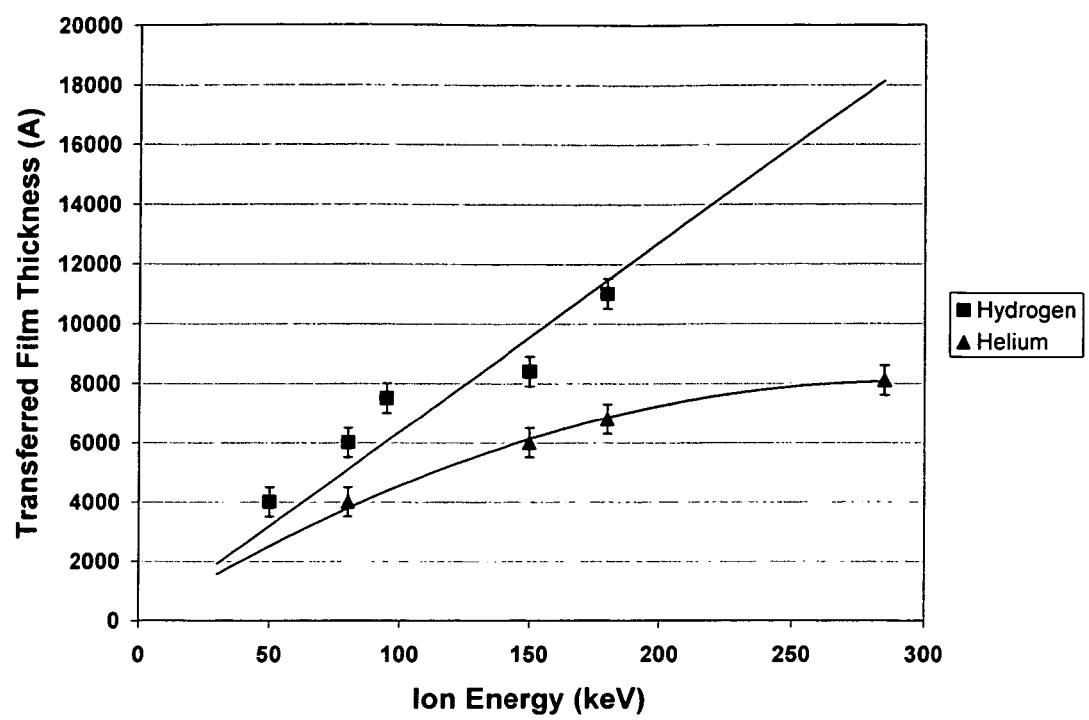
FIG. 8 is a diagram that shows the transferred layer thickness as a function of energy for $H^+$ and $He^+$ implantation.

Thin transferred layers of thickness 800 nm or greater can be achieved by implanting H$^+$ at an energy of at least 140 keV and He$^+$ at an energy of at least 280 keV. The relationship between ion energy and peak depth is illustrated in FIG. 8. When adjusting the thickness of the thin transferred layer by adjusting the ion energy of the implant, the dose is also adjusted so that the peak concentration is sufficiently high to lead to exfoliation. This can be done by taking a known functional dose at an established energy and using a TRIM simulation (the Transport of Ion in Matter, a software simulation program by James F. Ziegler) at the established energy to generate a predicted peak concentration of the implanted species at the end of range for the known functional dose. A second TRIM simulation at the new energy gives an estimate of the peak concentration per dose unit. Dividing the predicted peak concentration for the functional dose by the TRIM estimated concentration per unit dose at the new energy gives the required dose at the new energy.

The effect of other ions on the properties of sapphire have been studied in the literature, including light ions such as N$^+$, O$^+$, and Ar$^+$. Also, heavier ions such as Br$^+$ as well as transition metal ions have been studied. At a sufficiently high dose, all of these ions have been shown to induce blistering of the implanted sapphire, and thus offer potential paths to exfoliation process improvement. Of particular interest are O$^+$ and F$^+$. By implanting sapphire with O$^+$ the local stoichiometry at the end of the implanted range will be altered leading to a high density of interstitial and bond centered oxygen species. To ensure that the end of range is deep enough to enable the transfer of a layer that is sufficiently thick to be prepared for subsequent growth, the ion energy for both O$^+$ and F$^+$ should preferably be at least 160 keV resulting in a TRIM-predicted implant depth of approximately 200 nm. The upper limit of implantation energy is governed by the availability of implanters with sufficiently high current with implantation energies exceeding 400 keV being desirable. Because of the relative decrease in the diffusivity of oxygen and fluorine in the sapphire lattice and the increased damage per ion caused by O$^+$ and F$^+$ ions relative to H$^+$ and He$^+$, implantation at an elevated substrate temperature is desirable to facilitate dynamic damage annealing during the implant to prevent excessive buildup of vacancies and interstitial atoms and ultimately amorphization in the implanted sapphire. Preferably, the implantation of O$^+$ and/or F$^+$ should be conducted at a sapphire temperature of at least 250° C. O$^+$ and/or F$^+$ implantation at high dose ($>1 \times 10^{17}$ cm$^{-2}$) should provide sufficient internal pressure and implanted gas atoms to induce exfoliation in the absence of H or He. At lower doses ($1 \times 10^{16}$ to $1 \times 10^{17}$ cm$^{-2}$) O$^+$ and/or F$^+$ implantation should modify the mechanical and chemical properties at the end of the implanted range in such a way the subsequent implantation with H$^+$ and/or He$^+$ to a dose sufficient to induce exfoliation ($>1 \times 10^{17}$ cm$^{-2}$) will result in an exfoliation process with improved exfoliation kinetics. Thus, by implanting with O$^+$ and/or F$^+$ followed by implantation with H$^+$ and/or He$^+$ it is anticipated that the degree of exfoliation at a given temperature will be increased and that the temperature at which the onset of exfoliation begins will be reduced relative to implantation of H$^+$ and/or He$^+$ alone.

Optionally, the sapphire substrate temperature can be increased during ion implantation by thermally isolating the substrate as described in the previous section. In general, the transferred layer may be 200 nm to 2000 nm thick, such as 800 nm to 1200 nm thick. After the transferred layer is planarized by polishing and/or etching to form the thin layer 12 shown in FIG. 2H, the thickness of the thin layer 12 in the intermediate substrate is reduced to about 50 nm to about 1000 nm, such as about 200 nm to about 800 nm. However, the thin layer 12 may have greater or lesser thickness than described above, depending on the desired application and other process parameters.

Source Material with Improvements

Optionally, as illustrated in FIG. 3A, a photonic lattice structure can be formed by etching into the thin layer 12 with reactive ion etching or with other fabrication methods known in the art. This etch is preferably performed after producing the thin layer 12 with a weak interface 11 as illustrated in FIG. 2B. The etched areas 14 comprise patterns such as those illustrated in U.S. Pat. Nos. 5,955,749 and 6,479,371 or other patterns known in the art of photonic bandgap and periodic grating structures. Nominally the dimensions of such patterns are on the order of the wavelength of the light emitted by the light-emitting device structure. The etched areas 14 preferably do not penetrate weak interface 11 and remain contained within thin layer 12.

It should be noted that the crystalline structure of the source wafer and corresponding transferred thin layer may be off-axis from the conventional (0001) axis. In particular, a small angular deviation from (0001) axis between 0 and 3 degrees, such as 0.5 to 3 degrees, may be favorable for two-dimensional layer-by-layer growth of InGaN, AlGaN and GaN by MOCVD. The layer-by-layer growth would result in smoother growth morphology and reduced defect generation from lattice-mismatch strain in heterostructure growths such as Al-rich AlGaN on GaN.

The source wafer may be treated in a variety of ways to improve the efficacy of the layer transfer process. One method that may be used is the deposition of a protective layer applied to the surface of the substrate to prevent roughening or contamination of the surface during the implantation process. SiO$_2$ is one material that may be used. The protective layer may comprise the same layer as the bonding layer 13 described herein. Alternatively, the protective layer may comprise a sacrificial protective layer which is deposited on the source wafer before the implantation step and is then removed after the implantation is conducted through this layer. The bonding layer is then deposited on the source wafer after the removal of the sacrificial protective layer.

Another method that may be used is the deposition of an optically reflective layer on the front, back, or both sides of the source wafer. In the case of implantation into a sapphire source substrate or layer, a deposited Al layer of about 50 nm thickness reduces the dose required to achieve blistering. It is thought that by placing a film that is reflective on either or both surfaces of the substrate, the optical transparency of the substrate can be used to trap energy radiatively emitted from the defects formed at the end of the implant range. This in turn traps energy in the substrate by making radiative emission of the implant power less efficient. Thus, the substrate temperature rises to allow radiation and conduction from the outer surface of the substrate. While a thin Al films successfully improves the blistering behavior of the sapphire, the modified process should work with any thin film that is significantly reflective at the wavelength of emission from the subsurface defects. Thus, other reflective materials having a different thickness than 50 nm, such as 30 to 100 nm, may also be used. The reflective film should be sufficiently thick to be optically reflective but not so thick that it contributes significant stopping power against the impinging beam. The thin reflective film should also be conveniently removable following implantation. As is known in the art, such removal can be accomplished for example by a selective wet chemical etch or dry etching technique such as reactive ion etching. It should also be noted that while this technique improves the exfoliation behavior of sapphire, it may also improve the exfoliation of a variety of other semiconductor materials that have a wide bandgap, such as freestanding GaN, GaN on sapphire, SiC, diamond, and any III-nitride on sapphire or in freestanding form. The reflective layer may be a sacrificial layer which is removed after the implantation step or it may be retained during the bonding step.

Another method that may be used to improve the efficacy of the layer transfer process is to deposit a film of material to the source wafer that will decrease the likelihood of the thin layer developing cracks during the exfoliation process (i.e., an anti-cracking layer). Such a layer reduces the likelihood of cracks developing in the thin layer that would prevent transfer of large contiguous films. Suppression of cracks is particularly important in cases where CTE differences between the source wafer material and handle substrate material are driving the exfoliation. Furthermore, in source wafers such as freestanding GaN that may have defects present in their structure as provided, the use of an anti-cracking layer to stiffen the source wafer is of particular importance. The anti-cracking layer used to stabilize the source wafer can either be a thick, low stress material deposited by standard processing techniques such as CVD or sputtering or the film can actually be a flat, rigid substrate integrated with the substrate by wafer bonding with bonding layers or an adhesive. The material of the anti-cracking layer may comprise silicon oxide, silicon nitride, polycrystalline aluminum nitride or other suitable materials. In the case that the freestanding GaN has a large number of nucleation sites for substrate fracture as grown, completely inhibiting fracture in the GaN during bonding may be impossible. However, if the GaN is bonded to a stabilizing film or substrate, these fractures may be inhibited from entering that film or substrate. Thus, the freestanding GaN would retain its usefulness as a source wafer for the repeated transfer of many thin layers. The anti-cracking layer may be a sacrificial layer which is removed after the implantation step or it may be retained during the bonding step.

In another method, a layer of material may be deposited onto the source wafer and treated to improve the strength of the bond between the source wafer and handle substrate. This method may be performed before or after the implantation of the source wafer. In one preferred implementation, the deposited material is $SiO_2$ (i.e., the bonding layer 13) and the treatment is chemical-mechanical polishing. Each of the methods described above may be used alone or in combination with the other methods.

Handle Substrate Preparation

In FIG. 2C, thermally conductive materials with high melting point and similar or slightly higher or slightly lower thermal expansion coefficient as the thin layer 12 and/or source wafer 10 are preferably used as handle (also known as "support") substrate 20. The handle substrate 20 is also preferably compatible with the growth ambient encountered in the subsequent epitaxial growth, though this compatibility may be brought about by surface treatments following the transfer of the thin layer 12 from the source wafer 10. Furthermore, the handle substrate 20 should not decompose or produce contaminants that would have a substantial deleterious effect on subsequent epitaxial growth. For nitride semiconductors, the CTE of the handle substrate 20 is preferably in the range of $4\text{-}8\times10^{-6}$/K (averaged between room temperature and the temperature at which epitaxial growth of the device structure occurs) for compatibility with transferred thin layer 12 and source wafer 10. Setting the coefficient of linear thermal expansion of the handle substrate 20 in the above range can prevent stress-induced bowing or cracking of the semiconductor light-emitting device structure or the source wafer 10, and increase the production yield and long-term reliability of the semiconductor light-emitting device. More preferably the CTE of the handle substrate 20, averaged over the temperature range between room temperature and the temperature at which epitaxial growth of the device structure occurs, is engineered to be between 0% and 25% higher than that of GaN, averaged over the same temperature range. If the growth temperature is 1000° C., this corresponds approximately to a range of $5.2\text{-}6.3\times10^{-6}$/K, based on current measurements of the GaN temperature-dependent CTE available in the literature. Setting the CTE of the handle substrate 20 in this range can reduce or prevent the formation of cracks in the GaN device layers, which are known to form upon cooling after growth when the device layers are grown on substrates having a CTE that is significantly lower than GaN.

The material of the handle substrate 20 should be chosen such that the handle substrate 20 can be readily removed, as by chemical etching, without affecting the light-emitting device structure or the final substrate 50. For the thin layer 12 and source wafer 10 comprising $Al_zGa_{1-z}N$ or GaN, a handle substrate 20 preferably comprises the element molybdenum (Mo) or alloys of Mo. Mo is known to have a CTE of approximately $5.8\times10^{-6}$/K, when averaged over the temperature range of 20° C. and 1000° C. More preferably the alloy of Mo is chosen such that its recrystallization temperature exceeds the maximum temperature of the wafer during the growth process. If the recrystallization temperature is exceeded during processing, grain growth can occur in the Mo substrate resulting in changes in the stress state of the material, and embrittlement of the material after it is subsequently cooled. Doping of Mo with Titanium and Zirconium to produce what is commercially referred to as TZM, is known to increase the recrystallization temperature relative to Mo to the range of 1200° C. to 1400° C., which is 200° C. to 300° C. higher than the recrystallization temperature of elemental Mo and 100°

C. to 300° C. higher than the epitaxial growth temperature. TZM is a dilute alloy of Mo (greater than 98% and preferably at least 99%), Ti (between 0.2% and 1.0%), Zr (between 0% and 0.3%), and C (between 0% and 0.1%). Optionally, doping of Mo with small amounts (approximately 1%) of lanthanum oxide is known to increase the recrystallization temperature to the range of 1300° C. to 1500° C. Preferably the material for the handle substrate 20 is TZM.

The values of CTE reported for GaN in the literature are imprecise at room temperature and through the range of temperatures used for processing the wafer-bonded structures described herein. Additionally, the CTE of Mo and other candidate substrate materials is not precisely known either. Because of the imprecision in the known values of CTE, the handle substrate can be further optimized through experimental iteration by the modification of the CTE of the substrate material. To accomplish this, an alloy of Mo and tungsten (W) can be engineered to minimize the CTE-mismatch stress and associated risk of fracture or delamination in the bonded GaN/MoW substrate pair in thermal cycling prior to and during the exfoliation process. Similarly the MoW composition can be selected to minimize the stress-induced bow in the GaN/MoW substrates and associated temperature non-uniformities during growth, and to minimize cracking in the device layers after growth. Preferably a composition of MoW is selected which optimizes the yield of the exfoliation step and also optimizes the film growth quality and device performance through minimization or elimination of growth temperature non-uniformities and post-growth cracking. W is known to have a CTE of approximately $4.9 \times 10^{-6}$/K, when averaged from 20° C. to 1000° C. The CTE of alloys of MoW, averaged over this temperature range, can therefore be engineered to fall in the range of $4.9 \times 10^{-6}$/K and $5.8 \times 10^{-6}$/K. Such alloys containing 0-50 atomic percent W are commercially available. In particular, Mo alloy 366 as defined in ASTM Designation B-386-03 comprises a Mo-30% W alloy. Because the recrystallization temperature of W falls in the range of 1150° C. to 1350° C., MoW alloys are expected to have higher recrystallization temperatures than pure Mo. Furthermore, as was described above, the recrystallization temperature of these CTE-optimized MoW substrates can be increased further by the inclusion of dopants such as Ti or lanthanum oxide. In general, the handle substrate material may be selected to be closely CTE matched to the epitaxial III-nitride layer to be grown on the intermediate substrate. For example, the difference in CTE of the handle substrate and the III-nitride layer may be less than 20%, such 0 to 10%.

Handle substrates 20 comprising Mo or alloys of Mo can be produced in any number of ways from various forms of raw material. Generally the raw material is formed from fine powders of the constituent elements. These powders can be made into simple forms such as plate or rod, using powder metallurgy techniques such as press-and-sinter, hot isostatic pressing (HIP), or metal injection molding (MIM). Vacuum arc casting is another commonly used technique which can produce material having a lower porosity and lower concentration of inclusions and impurities, than material formed using powder metallurgy techniques. Alternative techniques such as plasma activated sintering, microwave sintering, and plasma pressure consolidation may also be used. Thin sheet material is obtained using rolling techniques as are known in the art, which may include annealing steps to remove stress induced by the rolling process. Preferably the material is cross-rolled to obtain superior machining characteristics. The raw material can be formed into the final substrate shape, using any number of techniques know in the art, including electrical discharge machining (EDM) wire cutting, water jet cutting, electrochemical etching, laser cutting, die-stamping, and conventional machining techniques such milling, sawing and facing. Generally high-speed machining tools such as tungsten-carbide tools are required for conventional machining of Mo and its alloys. Each material form and machining technique has specific cost and performance considerations. For example, rolled sheet of powder metallurgy Mo or TZM is readily available, inexpensive, and easily cut to shape, whereas vacuum arc cast material is known to be amenable to polishing to a mirror surface finish, owing to its low porosity and low inclusion concentration. High temperature cutting techniques such as EDM wire cutting and laser cutting must be employed with care, because the cut surfaces will be left in a brittle and stressed state due to the recrystallization that occurs during the cutting process. To avoid problems associated with recrystallization, low temperature cutting techniques such as electrochemical etching, water jet cutting, die-stamping, or conventional machining techniques can be used. Preferably, the substrates are cut from rolled sheet using electrochemical etching, milling, EDM wire cutting, die-stamping or water jet. In the case of EDM wire cutting, care must be taken to remove surface contamination if brass EDM wire is used, or optionally Mo EDM wire may be used. Owing to its batch-processing nature, it is expected that electrochemical etching can offer considerable cost advantages in mass-production. In this case a chemically-resistant mask can be applied to the sheet material. The mask can be a blanket film that is subsequently patterned using photolithographic or other patterning techniques, or the desired pattern can be preformed into the mask as it is applied. The rolled sheet preferably has a thickness of between 250 μm and 2 mm, and the substrate shape is preferably a disc with a diameter selected to be between 25 mm and 150 mm. Larger diameter discs may also be used. Preferably the rolled sheet is between 20% and 200% thicker than the final handle substrate, to allow for material removal during the grinding and lapping steps described below. Optionally the substrates can be fabricated by cutting discs from a rod, wherein said rod has been formed by powder metallurgy or preferably by vacuum arc casting, and wherein said rod has a diameter substantially equal to the desired diameter of the final substrate. EDM wire cutting, water jet cutting or conventional sawing and facing techniques can be used. Preferably water jet cutting or conventional sawing and facing techniques are used, because the EDM wire cutting is expected to leave a brittle surface which is not amenable to polishing to a low roughness finish. Optionally the discs can be tumbled after cutting to round the edges and remove any burrs from the discs.

The flatness of the handle substrates is such that the amount of warp across the handle substrate should not exceed 0.1% of the handle substrate diameter, and preferably should not exceed 0.02%. Warp is herein defined as the sum of the maximum positive and maximum negative deviation of the substrate top surface from an imaginary flat plane, where the imaginary flat plane is selected to be that plane which intersects the substrate top surface and minimizes the magnitude of the warp. In the case of discs cut from rod, this flatness can be obtained using conventional machining and/or EDM wire cutting techniques. Optionally, in the case of discs cut from rod, and preferably in the case of discs cut from rolled sheet, conventional mechanical and/or chemical-mechanical lapping and grinding techniques known in the art may be used to obtain the desired flatness. Preferably both sides of the handle substrate are ground and/or lapped in order to minimize stress-induced bowing of the handle substrate. Optionally, a fixed abrasive grinding and/or lapping technique are used in order to minimize the production of pits in the surfaces.

Additionally, the top surface and optionally the bottom surface of the handle substrate can be polished in order to obtain a smooth surface finish. Polishing of the bottom surface may be required in order to minimize bowing of the handle substrate. Preferably to minimize stress asymmetries and optimize the flatness of the handle substrates, double-disk processes as are known in the art are used throughout the grinding, lapping and polishing steps. Double-disk processes are those which simultaneously grind, lap, or polish the top and bottom surfaces of the substrate. Optionally for the case of handle substrates made from rolled sheet, the sheet material can be stress-relieved prior to grinding and/or prior to lapping and/or prior to polishing, in order to remove stresses in the material associated with the cold working. For the case of handle substrates comprising TZM, the stress relieving can be achieved by heating the material to a temperature between 1050° C. and 1250° C. for a time between 30 minutes and 120 minutes. Preferably the stress relieving procedure is performed in vacuum, hydrogen-assisted vacuum, or in an inert gas or reducing environment to prevent oxidation of the exposed TZM surface. Optionally the sheet material can be flattened by performing a stress relieving anneal while the sheet material is sandwiched between two flat surfaces and a pressure is supplied by means of a weight, clamp or other methods. This flattening procedure can be performed after any of the grinding, lapping and/or polishing steps, or it can be performed on the rolled sheet material before it is cut into discs. Preferably the edges of the top surface and optionally the bottom surface of the handle substrate are chamfered or rounded to facilitate handling and to minimize polishing scratches associated with fragmentation of the handle substrate edges during polishing. A chamfer or edge-round can be provided using conventional machining, tumbling, or edge-grinding techniques as are known in the art. Preferably the top surface after polishing has a peak-to-valley roughness of less than one micron.

Optionally, additional layers of material may be deposited directly on the top surface either after lapping or after polishing, and this additional layer can be further polished. This film can be deposited using techniques known in the art such as electron-beam evaporation, magnetron sputtering, and chemical vapor deposition techniques. As is known in the art, such vacuum-deposited films can be polished to a low microroughness surface finish. The additional layer material is selected for its polishing and adhesion properties, its CTE match with the substrate, and/or other performance characteristics such as its high-temperature stability and its reflectivity, and is preferably comprised of an amorphous film—or a film with a much finer polycrystalline grain size relative to the Mo substrate—of Mo, W, Rh, or TZM. More preferably, the film is comprised of TZM or Mo and is deposited using magnetron sputtering. The film thickness is preferably selected to be in the range of 2 to 5 times the peak-to-valley roughness of the top surface. Preferably, the film thickness is in the range of 0.5 microns to 5 microns. If high-purity materials are used in the deposition process, the deposited film can also serve as a diffusion barrier to Cu and other metallic impurities in the bulk Mo or Mo alloy substrate. This is both because the high-purity deposited film acts as a reservoir for metallic impurities from the bulk, and because the dense, preferably amorphous film does not feature crystalline grain boundaries that can act as diffusion paths for efficient migration of impurities to the outer surface of the Mo substrate.

Alternatively the handle substrate material comprises polycrystalline AlN (P-AlN). P-AlN can be formed using techniques known in the art such as tape-casting, hot-pressing, and press-and-sinter techniques. The material may also comprise a sintering aid such as yttria and/or calcium compounds which may be present at a concentration between 0.1% and 5% by weight and is used to promote adhesion of the AlN grains and increase the density and thermal conductivity of the sintered material. Optionally the sintering aid can be reduced or eliminated to minimize the possibility of contamination of the growth chamber and/or epitaxial device layers during the growth process as discussed below. In particular the level of calcium is preferably less than 25 ppm and more preferably less than 10 ppm. The average CTE of P-AlN over the temperature range 20° C.-1000° C. is approximately 5.6 ppm/K, and the thermal conductivity at room temperature is typically between 100 W/cm/K and 200 W/cm/K. P-AlN is commercially available in sheet form, and can be readily cut into disks using laser cutting or other techniques known in the art. Preferably the sheet thickness is between 0.25 mm and 2 mm and the disk diameter is between 50 mm and 150 mm. Larger diameter discs may also be used. Conventional grinding, lapping and polishing techniques as described previously can be used to obtain a substrate bow of less than 0.1% of the substrate diameter, and a RMS surface roughness of less than 50 nm. Optionally an edge chamfer or edge round is provided to the top surface or to both the top and bottom surface, in order to facilitate handling and polishing.

For the case that a molybdenum alloy or P-AlN handle substrate is used to form an intermediate substrate for HVPE growth of a III-nitride film, an encapsulating layer can be provided to protect the handle substrate material from the highly reactive halide compounds such as HCl and GaCl that are present in the HVPE growth process. The encapsulating layer comprises a film that covers at least exposed surfaces of the handle substrate. Candidate encapsulating layer materials comprise silicon dioxide, silicon nitride, silicon oxi-nitride, amorphous silicon carbide, aluminum oxi-nitride and alumina, and can be deposited by sputtering, plasma-enhanced CVD, low-pressure CVD, e-beam evaporation, or other techniques known in the art. Preferably the thickness of the encapsulating layer is between 50 nm and 2000 nm.

Other handle substrate materials comprise single-crystal semiconductor wafers that are commercially available and encapsulated single-crystal semiconductor wafers. Such semiconductor materials are chosen to have melting temperatures above the processing temperatures associated with the growth and fabrication of GaN-based devices. Preferably the melting temperature of the semiconductor substrate material is greater than 600° C. and 1000° C. for the case of GaN-based devices grown by MBE and MOCVD, respectively. The semiconductor materials are preferably chosen to have a CTE in the range of 5 ppm/K to 8 ppm/K when averaged over the temperature range of 20° C. to 1000° C. Suitable semiconductor substrate materials comprise single-crystal wafers of GaAs, single-crystal wafers of GaP, and single-crystal wafers of InP, for which the melting temperatures are approximately 1240° C., 1460° C., and 1060° C. respectively. Preferably the single-crystal wafers are provided with an encapsulating layer to prevent decomposition of the crystal surface when the substrates are heated during the growth of the GaN device layers. Suitable encapsulating layers comprise PECVD or sputter deposited films of silicon dioxide, silicon nitride, silicon oxi-nitride, aluminum nitride, aluminum oxi-nitride, alumina, and silicon carbide. Preferably the thickness of the encapsulating film is between 50 nm and 2000 nm.

The handle substrates are engineered to be structurally stable in the growth environment at the growth temperature of the epitaxial device layers. Preferably, a structurally stable handle substrate is one for which the change in shape during heating to the growth temperature in the growth environment is such that the warp of the substrate at the growth temperature prior to epitaxial growth does not exceed 0.15% and more preferably does not exceed 0.05% of the handle substrate diameter. The handle substrates can be engineered to be structurally stable by selecting handle substrate materials that do not undergo bulk recrystallization, melting, or other phase changes at or below the growth temperature, and/or do not decompose in the growth environment at the growth temperature. In cases where the thickness or material properties of the handle substrate material are not adequate to maintain an acceptable level of warp during the growth process, a backside layer can be provided to the handle substrate such that a stress-thickness product in the backside layer at the growth temperature substantially balances the stress-thickness product in the epitaxial device layers and/or in the transfer layer. Suitable backside layers can comprise amorphous or polycrystal films of silicon nitride, silicon dioxide, silicon oxinitride, aluminum nitride, aluminum oxi-nitride, alumina, silicon carbide or other materials selected for their CTE, thermal conductivity, ease of removal, cost, and/or chemical stability in the growth environment and at the growth temperature. These backside layers can be deposited by sputtering, CVD, PECVD, evaporation, or other methods as are known in the art.

The CTE of other handle substrate materials may be specifically engineered to match the CTE of GaN or other materials by altering the composition of the substrate material.

Preparation for Wafer Bonding

In FIGS. 2D, 2E, and 3B, at least one surface of the thin layer 12 and/or handle substrate 20 is optionally provided with bonding layers 13, 21 in a manner known in the art. Such bonding layers may comprise $SiO_2$, $Si_3N_4$, $Al_2O_3$, AlN, Al-doped ZnO, or other materials known in the art. Optionally, the stoichiometry of the bonding layer can be modified to adjust the stability and chemical nature of the deposited layer. For example, by increasing the Si to N ratio in silicon nitride from the 3:4 ratio (i.e., by forming a silicon rich silicon nitride in which the Si:N ratio is greater than 3:4), the stress of the deposited layer is reduced and the resulting layer is better able to getter gas species outgassed from the bonded interface during thermal processing. Suitable bonding layer materials are subject to the requirements that they can be deposited with sufficient purity so as not to degrade the electrical performance of the finished device structure, are thermally stable to the growth temperature of the epitaxially grown device structure (for example, >1000° C.), and can be polished to a low local micro-roughness (preferably <1.0 nm root-mean-square roughness between larger defects). These layers can be deposited by conventional techniques comprising electron-beam evaporation, sputter deposition, ion-assisted sputter deposition, chemical vapor deposition, plasma-enhanced chemical vapor deposition, and other techniques. The layers may also be alloyed with other materials or implanted to improve their thermal conductivity, electrical conductivity, or both.

The Mo or Mo-alloy may, optionally, be annealed prior to deposition of an adhesion layer or bonding layer and eventual bonding. In the case of Mo or a related handle substrate, this anneal step serves several purposes. First, it removes volatile surface oxides, organics, and other sources of contamination that may impact the adhesion of a deposited bonding layer. Additionally, depending upon the fabrication technique used to make the Mo or Mo-alloy substrates, the substrates may exhibit some slight porosity that leads to out-gassing at high temperatures. By performing a high temperature anneal above 800° C. prior to further processing, the magnitude of out-gassing during subsequent high temperature processes such as epitaxial growth can be minimized. In this and all other high temperature thermal processing involving a Mo or Mo-alloy substrate subsequently described herein, the annealing ambient should be a non-oxidizing ambient, such as ultra-dry nitrogen, a hydrogen/nitrogen mixture, a vacuum, or another reducing environment known in the art to prevent oxidation and decomposition of the Mo substrate. This is particularly important for thermal processing at temperatures above 300° C. Optionally an encapsulating layer can be provided to protect the Mo or Mo alloy handle substrate from oxidation. To increase the strength of the adhesion between the bonding layer and the handle substrate, an adhesion promoting film or adhesion layer can be deposited. For the case of a Mo or Mo alloy handle substrate, suitable adhesion layer materials comprise TiN, Ti, Cr, molybdenum silicide, any alloy of Mo, Si, C, and N, or another adhesion layer known in the art. As with the bonding layer material itself, the selection of the adhesion layer is subject to the requirements that the layer materials are thermally stable through the growth temperature of GaN, and that the constituents of the bonding layer do not diffuse into the GaN degrading the electrical properties of the active device structure. Preferably the adhesion layer comprises TiN or Ti and has a thickness of between 5 nm and 75 nm. Optionally the film comprises a multi-layer stack of TiN and Ti, such as a stack comprising between 0 nm and 30 nm TiN, 10 nm and 150 nm Ti, and 5 nm and 50 nm TiN. In order to improve the resistance of the adhesion layer to oxidation, the adhesion layer can comprise a TiAlN alloy, or a multilayer stack comprising TiN and AlN or Ti, TiN, Al, and AlN, where the total thickness of the stack is between 20 nm and 200 nm.

For the case of a handle substrate comprising P-AlN, impurities and/or the constituents of sintering aids such as yttrium, calcium, and aluminum, can be susceptible to diffusion and/or reaction with the bonding layer when the bonding layer is annealed above 800° C. In order to prevent such diffusion and/or chemical reactions from occurring, a diffusion barrier can be provided between the P-AlN top surface and the bonding layer. Candidate diffusion barrier materials comprise silicon nitride, amorphous silicon carbide, alumina, aluminum nitride, and titanium nitride, and can be deposited by sputtering, plasma-enhanced CVD, low-pressure CVD, e-beam evaporation, or other techniques known in the art. Preferably the thickness of the diffusion barrier layer is between 5 nm and 500 nm. Optionally an adhesion layer such as a layer of silicon dioxide or silicon carbide can be provided between the P-AlN handle substrate surface and the diffusion barrier. Preferably the adhesion layer is between 5 nm and 50 nm thick. It is possible that high vapor pressure elements such as calcium, and/or rapidly diffusing elements such as yttrium, can migrate from the P-AlN to the epitaxial device layer when the intermediate substrate is heated to the growth temperature, either by out-gassing of the elements into the growth chamber environment and subsequent deposition onto the growth surface, or by bulk diffusion into the epitaxial layers. Optionally the substrate can be fully encapsulated by the diffusion barrier material in order to prevent the migration of these elements to the growth chamber and/or to the epitaxial device layer.

During growth of III-nitride material on intermediate substrates comprising P-AlN, extraneous growth of the III-nitride material can occur on the exposed surfaces of the P-AlN handle substrate. This extraneous growth can be of poor quality and not suitable for device fabrication. In cases where the intermediate substrate comprises a thin transfer layer 12 that does not fully cover the top surface of the handle substrate, and/or where the edges of the handle substrate are exposed, an encapsulating layer can be provided to prevent extraneous growth of the III-nitride material on the exposed regions of the handle substrate. The encapsulating layer may comprise a diffusion barrier layer material, a bonding layer material, a combination of both a diffusion barrier and a bonding layer material, or a layer of another material selected for its resistance to extraneous growth, adhesion properties, stability at the growth temperature and in the growth environment, and resistance to chemical attack during pre-growth processing. Preferably the encapsulating layer material comprises silicon nitride, silicon dioxide, or silicon oxi-nitride.

Providing bonding layers 13 and 21 reduces the surface smoothness requirement of the thin layer 12 and/or handle substrate 20 due to the improved mechanical compliance of the bonding layer relative to GaN and Mo. Additionally, chemical-mechanical polishing of bonding layers 13, 21 to reduce the surface micro-roughness and thereby improve wafer bonding strengths is already known in the art and can be performed easily at low cost if needed, thus eliminating the costly polishing procedures for difficult-to-polish surfaces such as GaN or Mo.

Preferably, the deposited bonding layer can be densified prior to polishing, by annealing the film at a temperature between 200 and 1100° C. to reduce the quantity of hydrogen and other gaseous species trapped in the bonding layer material prior to polishing the bonding layer. Additionally, by densifying the bonding layer material to a high temperature prior to polishing and subsequent bonding, the density of the deposited layer is increased, thus reducing the risk of buildup of stress in the bonding layer that may contribute to film adhesion instability during post-bonding processing. By performing this outgassing anneal prior to polishing, any stoichiometry loss at the surface of the bonding layer can be recovered by polishing away the surface material to leave a smooth (<1.0 nm rms-roughness) and homogeneous film. More preferably, the out-gassing anneal is conducted at a temperature above that necessary to ensure that out-gassing from the bonding layer during growth of the device structure at temperatures in excess of 1000° C. do not lead to failure of the bonded interface resulting from gas accumulation. This temperature can be determined by a combination of secondary ion mass spectroscopy (SIMS) analysis and sample fabrication and stress testing. This out-gassing anneal process can be advantageously performed to reduce residual stresses in the bonding layer film, and additionally to reduce the concentration of trapped gas in the bonding layer. For the case where an adhesion layer is provided between the bonding layer and the handle substrate surface, annealing of the layer stack prior to polishing can advantageously promote the thermal stability of the adhesion layer. In particular, if a molybdenum alloy handle substrate such as TZM is used, and if an adhesion layer is provided that comprises a film of TiN, then the adhesion layer is susceptible to structural and chemical instabilities such as agglomeration and/or oxidation if it is heated to over 1000° C. after the bonding layer has been polished. Annealing of the adhesion layer/bonding layer stack prior to polishing, at a temperature between 800° C. and 1150° C. for a period of between 5 minutes and 120 minutes, substantially reduces or eliminates any oxidation or agglomeration the adhesion layer during subsequent heating to over 1000° C. after the bonding layer has been polished. In this way an adhesion layer comprising a film of TiN can be rendered thermally stable at temperatures over 1000° C., by performing an annealing step of the adhesion layer/bonding layer stack prior to polishing of the bonding layer.

For the case that the handle substrate comprises yttria-containing P-AlN and the bonding layer comprises silicon dioxide, Y—Al—O—Si compounds can form in localized regions of the bonding layer upon annealing above 1000° C. The presence of these compounds impacts the local polishing characteristics of the bonding layer and can result in shallow depressions in the polished bonding layer. In order to mitigate this effect, a diffusion barrier layer can be supplied as described above, or the densification temperature of the bonding layer prior to polishing can be selected to be at a temperature below which diffusion occurs. Preferably the densification temperature in this case is between 800° C. and 1050° C. Optionally the level of yttria sintering aid in the handle substrate material may be reduced in order to minimize the reaction of the sintering aid with the bonding layer. In cases where a diffusion barrier is not provided, or if the diffusion barrier is not adequate to prevent diffusion of yttrium and/or aluminum, and/or the densification temperature is not low enough to prevent the diffusion, the level of yttria in the handle substrate material is preferably less than 0.5% by weight. Optionally the P-AlN handle substrate can be formed by hot-pressing, which can require less sintering aid than tape-casting or press-and-sinter techniques. As noted above, a single layer can serve as a bonding layer, adhesion layer, diffusion barrier and/or encapsulating layer, depending on the material of the layer.

For light-emitting device structures shown in FIGS. 3A and 3B comprising photonic lattice structure etched in thin layer 12, the optional bonding layer 13 conforms to the exposed surfaces of the etched areas 14. The optional bonding layer 13 advantageously serves as surface passivation for the exposed etched areas 14 and prevents surface decomposition and geometrical distortions of etched areas 14 during subsequent processing and epitaxial growth steps. The bonding layer(s) also serve as sacrificial release layers to allow the handle substrate 20 to be removed from the completed device if desired. Additionally, the bonding layers can be selected to serve as a diffusion barrier between the Mo or Mo-alloy substrate and the thin layer 12 to inhibit the diffusion of metallic impurities from the Mo or Mo-alloy substrate to the device structure during high-temperature epitaxial processes. Such bonding layers comprise TiN, amorphous Mo, amorphous TZM, or other layers known to those skilled in the art.

Not shown are other optional processes that may be incorporated to improve the quality of the bond between the thin transferred layer and the handle substrate. These processes include, but are not limited to an ion implantation that amorphizes the surface of thin transferred layer, thereby removing threading dislocations at the surface in the case of GaN material and smoothing the surface.

The surface of the bonding layer, the surface of the handle substrate, or both may also be treated, such as by etching, to increase their porosity. These pores are useful for allowing trapped gas and implanted species to diffuse away from the bonded interface.

Because of the extremely high cost of freestanding GaN substrates, minimizing potential yield losses during all processes involving the GaN substrate is desirable. To improve the mechanical integrity of the freestanding GaN substrate during bonding it may be advantageous to attach the substrate to a mechanical support substrate. Such a GaN/mechanical support structure would reduce the yield loss for stressful processing steps in the fabrication of a GaN/Mo intermediate substrate comprising ion implantation, bonding layer polishing, and reclaim of GaN substrate for producing more intermediate substrate. Perhaps most importantly a GaN/mechanical support structure will make the GaN substrate less susceptible to mechanical failure due to thermal stresses in the GaN and Mo or Mo alloy bonded pair that are induced by temperature excursions between the bond initiation temperature and the exfoliation and transfer of the thin GaN layer to the Mo or Mo alloy substrate. The risk of GaN fracture due to thermal stress induced in the bonded Mo/GaN structure can be further complicated by the possible presence of residual defects such as small cracks or polycrystalline inclusions in the freestanding GaN substrate. These defects in the freestanding GaN substrate could serve as nucleation sites for further fractures to occur. The mechanical support substrate should be selected to have a CTE very near that of GaN, for example within 0 to 20% of the CTE of GaN. Any significant deviation from the CTE of GaN should be a lower CTE, rather than a higher CTE. This will ensure that the GaN substrate is in compressive stress, making it less susceptible to cracking or fracture. Candidate materials for mechanical support substrate that meet these requirements comprise W and MoW alloys. Because these materials are metallic, they are less brittle than GaN and thereby less prone to fracture. The GaN substrate can be mounted to the mechanical support substrate using a material that is tolerant of the high temperatures experienced in the fabrication steps of the GaN/Mo intermediate substrate, in particular the exfoliation anneal. Candidate mounting materials include ceramic pastes, metallic films, and compliant oxides.

Wafer Bonding and Layer Transfer

In FIGS. 2F and 3C, the thin transferred layer 12 with the source wafer 10 is wafer bonded to the handle substrate 20. The wafer bonding can be achieved by direct wafer bonding, by bonding with optional bonding layers 13, 21, or by other well-known techniques as disclosed in "Semiconductor Wafer Bonding" by Q.-Y. Tong and U. Gösele. For light-emitting device structures comprising a photonic lattice structure etched in semiconductor layer 12, the etched areas 14 advantageously collect trapped gas and implanted species and prevent formation of bubbles from excess gas pressure at the bonded interface. The improved bubble-free bonded interface increases the yield and efficiency of the light-emitting device structure. The photonic lattice structure formed by etched areas 14 simultaneously improves the light extraction efficiency of the light-emitting device according to the embodiments of the invention.

Thermal stress, mechanical stress, or chemical etching are applied to the weak interface 11 after wafer bonding to exfoliate the thin layer 12 from the source wafer 10 as illustrated in FIG. 2G leaving the thin layer 12 bonded to the handle substrate 20. The source wafer 10 is preferably removed by thermal annealing which causes the weak interface 11 to break and results in exfoliation of the thin layer 12 from the source wafer 10.

When performing wafer bonding and layer transfer of a thin sapphire transferred layer 12 from a sapphire source wafer 10 to a handle substrate 20 that has been prepared as described in the previous section, the surfaces of both substrates are prepared by removing organic contamination with a solvent clean. Preferably, this process includes mega-sonic or ultra-sonic cleaning in acetone and methanol for a period of 10 seconds to 60 minutes, followed by a deionized water rinse. The surfaces are then dried by a combination of nitrogen blowing and spinning the sample. The surfaces of the substrates are then prepared for wafer bonding using a plasma surface activation with an Ar, $O_2$, $N_2$, or other plasma species. Preferably, the plasma treatment is performed with an atmospheric pressure plasma system using $O_2$ at a power of 200 to 400 W using a scanning plasma head for a total number of passes of 1 to 10 at a rate of 25 mm/s. At any point during the surface preparation, prior to loading the substrates into the bonding apparatus, a $CO_2$ particle removal technique can be applied to further clean the substrates prior to bonding. This consists of exposing the bonding surface to a jet of gas and solid phase $CO_2$ while maintaining the substrate temperature and ambient in such a way that condensation of moisture on the bonding surface is prevented. Preferably, the substrates are maintained at a temperature of at least 50° C. and are exposed to a $CO_2$ jet for longer than one second. The cleaned, prepared surfaces are then brought into contact at a controlled substrate temperature in a controlled gas ambient using a wafer bonding apparatus. Preferably, the bond initiation temperature is between room temperature and 400° C. More preferably, the bond initiation temperature is between 150 and 350° C. Preferably, the bond ambient is a vacuum in the pressure range of $10^1$ to $10^{-6}$ torr. As is described in detail in the section titled "Stabilization of the thin transferred layer", the insertion of a bond strengthening anneal at a temperature above the bond initiation temperature but below the exfoliation temperature can dramatically increase the bond strength prior to exfoliation. During bond initiation and thermal processing to transfer a thin sapphire film, the application of pressure normal to the bonded substrate surfaces increases the extent and stability of the transferred sapphire film. Preferably, this bonding pressure is between 0 and 20 MPa. More preferably, this bonding pressure is between 1 and 10 MPa. To complete the exfoliation of the thin sapphire film, the temperature of the wafer-bonded sapphire-handle structure is raised to a peak temperature between 450 to 600° C. depending on the implantation conditions of the sapphire. The duration of the exfoliation step is between 1 and 60 minutes depending on the exfoliation conditions.

When performing wafer bonding and layer transfer of a thin GaN layer 12 from a freestanding GaN source wafer 10 to a handle substrate 20 the wafer bonding and layer transfer process is similar as the process for transferring a thin film of sapphire described above with the following exceptions. The improved CTE-match between he GaN source wafer and the handle substrate allows the bond initiation temperature be lower, because the temperature excursion between bond initiation and layer exfoliation induces less strain on the wafer-bonded GaN-handle structure. Thus, bond initiation is preferably performed between room temperature and 250° C. More preferably, the bond is initiated at a temperature between 50 and 150° C. Because GaN is a more brittle material than sapphire, the pressure applied during the bonding thermal cycle is reduced. Preferably, the bond pressure is between 0 and 10 MPa. More preferably the bond pressure is between 0.5 and 5 MPa. Because the exfoliation kinetics for GaN are superior to sapphire, the exfoliation temperature can be lower, preferably ranging from 350 to 600° C.

Alternative Wafer Bonding and Layer Transfer Strategies

The CTE-mismatch between sapphire and GaN (and hence any GaN CTE-matched handle substrate) presents challenges to wafer bonding and layer transfer. To minimize the impact of this CTE-mismatch, one of several alternative wafer bonding and layer transfer methods can be used.

The use of two wafer bonding and layer transfer steps along with first and second handle substrates can be used to fabricate the final intermediate substrate for GaN growth consisting of a transferred sapphire thin film bonded to the second handle substrate. The structure of the first handle substrate is such that the handle can be selectively removed from a sapphire thin film supported on the substrate following wafer bonding of the exposed face of the transferred sapphire thin film to a second handle substrate that is closely CTE-matched to GaN and preferably comprises TZM or P-AlN. This so called double-bond process would require the use of a sacrificial lateral etch layer in the first handle substrate to enable selective release of the sapphire film onto the second handle substrate. This etch layer should be selectively etched relative to the second handle substrate and the bonding layer used in the final intermediate substrate structure. Additionally, planarization and smoothing of the transferred sapphire thin film supported on the first handle substrate for wafer bonding may be performed. This can be done by deposition of a bonding layer and subsequent polishing as described in the section on "Preparation for wafer bonding". As an alternative to the use of a sacrificial lateral etch layer, a transparent first handle substrate could be used in conjunction with a bonding layer that can be decomposed, ablated, or otherwise weakened through the use of an optical process such as laser irradiation. Preferably, the first handle substrate removal can be enabled by bonding the implanted sapphire source wafer to a material that is CTE-matched to sapphire, or has a CTE that is between GaN and sapphire. As an alternative to the lateral etch layer, the first handle substrate may be selectively etchable, grindable, or polishable relative to sapphire and the second handle substrate and bonding layer. Advantageously, by using a double-bond process the starting, epi-ready surface of the sapphire source wafer is exposed in the final intermediate substrate, easing the process of damage removal and preparation of the surface of the transferred layer for subsequent GaN growth.

An additional alternative wafer bonding approach to minimize the adverse impact of the CTE-mismatch between sapphire and GaN-CTE-matched handle substrates is to thin the sapphire source wafer to minimize the elastic strain energy during wafer bonding and layer transfer while simultaneously increasing the stress in the bonded sapphire wafer that is thought to assist in the exfoliation of the sapphire thin film. This can be done for sapphire as thin as 100 µm for R-plane oriented sapphire and 150 µm for C-plane sapphire. By supporting an even thinner sapphire source wafer of either R- or C-plane orientation on a mechanical handle substrate that is CTE-matched to the final handle substrate, the sapphire source material can be made even thinner. This could be accomplished by bonding a thinned sapphire source wafer to the same material as the final handle substrate using several strategies such as direct wafer bonding, adhesive bonding with a material known in the art comprised of BCB, spin on glass, or other adhesive, or by eutectic bonding with a eutectic composition that is chosen to enable subsequent thermal processing without concern for debonding of the sapphire source wafer from the mechanical handle substrate. After the wafer is bonded to the mechanical handle substrate, a combination of grinding, lapping, and polishing can be used to further thin the source wafer, preferably to less than 50 µm thickness. More preferably, the source wafer would be further thinned to less than 25 µm. After thinning, the surface may require deposition of a bonding layer and subsequent polishing to prepare the surface for bonding. Preferably the final root-mean-square surface roughness is <1.0 nm.

Optionally, a sapphire transferred layer on a TZM or P-AlN handle substrate can be fabricated by bonding a thinned sapphire substrate to the handle. The sapphire can then be subsequently thinned by a combination of grinding, lapping, and polishing resulting in a thin film preferably thinner than 10 µm and more preferably thinner than 5 µm. Subsequent to the mechanical polishing of the sapphire, any subsurface lattice damage due to the polishing process can be removed by the use of a dry etch process to remove preferably at least 1 µm of sapphire.

Optionally, the wafer bonding and layer transfer step can include the use of pre-patterned handle substrates to allow local relaxation of the stress and strain caused by the CTE-mismatch between sapphire and the handle substrate. The patterned handle substrate would consist of a grid of etched trenches in the prepared bonding layer on the handle substrate. The spacing of the grid would match the ultimate LED die which the wafer-bonded intermediate substrate will be used to fabricate. The depth of the trenches can be shallow, preferably greater than 5 nm deep. The width of the trenches can be selected to either leave an intact film above the trench following layer transfer and thinning or to leave an open trench with no sapphire film spanning the gap. As a general rule of thumb, if the trench width is narrower than the final thickness of the sapphire thin film (<200 nm) the sapphire will span the trench and remain intact.

Optionally, an alternative bonding and layer transfer process for transfer of sapphire thin films to a handle substrate could take advantage of the optical transparency of the sapphire substrate to selectively irradiate the bonded interface and the implantation-induced defect structures with a laser source to selectively anneal the implanted region of the bonded structure and improve the exfoliation kinetics of the sapphire while reducing the temperature excursion and associated elastic strain energy and stress that the full bonded structure undergoes. Lasers suitable for this process include CO, HF and DF operated in pulsed mode.

Stabilization of the Thin Transferred Layer

In the case of a mechanically rigid source wafer such as sapphire, there can be a propensity of the thin transferred layer to spontaneously peel away from the handle substrate or bonding layer, if a bonding layer has been deposited, following the layer transfer process. The rate at which the thin transferred layer peels away from the handle substrate can increase with the magnitude of the in-plane stress in the film. This stress can be introduced through damage induced during the implantation process and/or through CTE mismatch stress developed during the bonding and layer transfer process. It is also observed that the delamination of the film can be substantially accelerated if the film is exposed to a humid environment or is dipped in water. It is believed that the water acts to reduce the surface energy of the freshly exposed surfaces as the delamination proceeds, as has been reported earlier for bonded silicon wafers (see Tong, Q.Y. et. al. in Journal of the Electrochemical Society 139 (11) 1101-1102 (1992)). Thus, the thin transferred layer is preferably not exposed to a humid environment or water during processing steps immediately following layer transfer and the process preferably is conducted in a dehumidified environment.

The propensity of a transferred film to peel away from the bonding interface can be higher for layers such as sapphire whose surfaces are relatively chemically inert and stable against formation of covalent bonds with other surfaces. The inert nature of the surface can be caused for example by the presence of hydroxyl groups that chemically passivate the surface, or it can be due to the intrinsic bond strength of the covalently bonded source material. Furthermore the rigidity of the source wafer often prevents the bonding surfaces from coming into intimate contact under application of typical bonding pressures, which must be low enough to prevent fracture of the source wafer or handle substrate. In order to promote strong adhesion between such inert layers and the handle substrate, it is preferable to first deposit a bonding layer as described previously, onto the surface of the source wafer. Adhesion between the bonding layer and the source wafer surface can be enhanced by plasma activation of the wafer surface prior to deposition, as commonly occurs for example in the PECVD process for depositing $SiO_2$ or $Si_3N_4$ films. Thus, the bonding layer 13 may comprise silicon oxide, silicon nitride and/or aluminum nitride, which are deposited by a plasma-enhanced CVD process to simultaneously perform a plasma activation of the source wafer 10. Alternatively, a separate plasma activation treatment of the source wafer 10 may be performed prior to the deposition of the bonding layer 13. In this case, the bonding layer 13 may be deposited by a method other than PECVD. Optionally an adhesion layer is inserted between the bonding layer and the handle substrate. Preferably an annealing procedure is performed as described previously to densify the deposited bonding layer and further increase the adhesion strength. For the case of a bonding layer deposited on a sapphire source wafer, the annealing temperature is preferably between 600° C. and 1000° C.

Additionally, by inserting a low-temperature bond-strengthening anneal step in the wafer bonding and layer transfer thermal cycle prior to the exfoliation of the transferred layer the stability and extent of the thin transferred layer on the handle substrate after bonding and exfoliation can be substantially improved. This is correlated to an increase in the bond strength during the low temperature anneal. This improves the bond strength at the time of exfoliation, improving the extent and uniformity of the exfoliation process. Furthermore, by transferring a more strongly bonded thin layer, buckling and fracture of the highly stressed thin transferred layer are less energetically favorable, leading to reduced buckling in later processing. The efficacy of the low-temperature bond-strengthening anneal is improved by increasing the temperature difference between the bond initiation temperature (that temperature at which pressure is applied to the sapphire-handle stack to initiate bonding) and the bond-strengthening anneal temperature. Preferably, bond initiation is performed at or below 150° C. and the bond-strengthening anneal is conducted at 250° C. or above for at least 30 minutes. Increasing the duration of the bond-strengthening anneal results in improved bond strength between the sapphire and the handle substrate with a saturation of bond strength generally being reached within 20 hours of bond initiation. However, maximizing the difference between the bond initiation temperature and the bond-strengthening anneal temperature reduces the time required to reach an acceptable bond strengthening. The bond-strengthening anneal can be conducted with or without an applied pressure. By annealing without an applied pressure, a simple batch furnace process can be used to perform the bond strengthening anneal improving process throughput, reducing capital equipment costs, and resulting in a more manufacturable process.

In some cases it will be desirable to bond the handle substrate to the bare surface of the source wafer. Optionally an adhesion layer and preferably a bonding layer are first deposited on the handle substrate surface prior to bonding. In such cases where the bare surface of the source wafer is bonded to a handle substrate, or where the bare source wafer is bonded to the surface of a bonding layer deposited on a handle substrate, annealing steps can be performed following the layer transfer process in order to increase the strength of the bond. Such annealing steps can optimize the stability of the thin transferred layer against peeling and lift-off during subsequent process steps. Preferably an external pressure is applied normal to the surface of the thin transferred layer to prevent the thin layer from peeling during the annealing procedure. This pressure is preferably between 0.5 MPa and 50 MPa and more preferably between 1 MPa and 20 MPa. The application of this pressure on the thin transferred layer enables more efficient bonding than is possible with pressure applied prior to layer transfer, owing to the decreased rigidity of the thin transferred layer relative to the thick source wafer. Optionally a sheet of material that is slightly compressible is inserted between the point at which pressure is applied and the top surface of the thin transferred layer, in order to more efficiently distribute the pressure over the thin layer and facilitate intimate contact of the bonding surfaces. Suitable materials include graphite, mica, or any other material that is compressible in a direction normal to its surface and maintain mechanical rigidity in the directions parallel to the surface. The annealing temperature is selected to be in a range where substantial covalent bonding occurs between the surface of the thin transferred layer and the surface to which it is bonded. In the case of a thin sapphire layer wafer bonded to a silicon dioxide, silicon nitride, or aluminum nitride bonding layer, this temperature preferably falls in the range of between 500° C. and 1400° C. and is more preferably between 600° C. and 1000° C. The duration of the annealing process is preferably between 10 minutes and 10 hours.

Reusing Source Wafer

After the exfoliation, the source wafer 10 can be reused in subsequent repetition of the process by removing the ion implantation damage and roughness of the top surface of the source wafer 10 through the use of accepted semiconductor processing techniques such as chemical etching or chemical mechanical polishing. For thin layers transferred from the Ga-face of freestanding GaN substrate as the source wafer, hot KOH at 5 to 50% dilution in deionized water at a temperature between 25° C. and 200° C., preferably between 40° C. and 110° C., for a duration between 10 seconds and 60 minutes, depending on the dilution ratio and total implantation dose, preferentially etches the implantation-induced damage at the exfoliated surface of the GaN source wafer leaving a smooth surface that is suitable for bonding following the deposition and polishing of a bonding layer on the GaN source wafer and subsequent implantation of the structure, as described below. Cross-sectional TEM analysis shows that the wet etch with KOH does not completely remove subsurface damage. For this reason, if it is desirable to completely remove subsurface implantation damage, a polish step or a dry etch comprising RIE may be necessary to remove subsurface damage while maintaining planarity and smoothness. When using a caustic wet etch to selectively remove damaged GaN from the Ga-face, it is important to protect the N-face using an encapsulating film that is not etched by the wet etch chosen for the Ga-face. Preferably, the encapsulating film comprises silicon dioxide, silicon nitride, amorphous silicon carbide, aluminum oxide or some other material that is conveniently deposited using chemical vapor deposition (CVD), such as plasma-enhanced or low-pressure CVD, or physical deposition techniques, such as sputter deposition or thermal evaporation.

One related application of the Ga-face GaN reclaim process described above is as a planarizing step for the growth surface of related III-nitride semiconductors. By implanting to a depth that is much greater than the spatial separation and peak-to-valley magnitude of surface features on the substrate, the exfoliation is expected to be highly planar with ~10 nm of surface roughness. Subsequently, by applying a damage-selective wet etch, the exposed surface can be highly planarized and the roughness reduced. Further processing such as RIE can then be used to remove the subsurface implantation damage. A brief wet etch would then leave a surface that is considerably improved for III-Nitride growth. Preferably, the III-Nitride freestanding semiconductor is AlN and the implantation process consists of implanting with a dose sufficient to induce exfoliation to a depth of at least 500 nm followed by a wet etch in a KOH solution and a dry etch using a Cl-based RIE or ICP RIE step. As with GaN reclaim, it is desirable to protect the N-face of the AlN using a deposited encapsulating film.

For reusing freestanding GaN source wafer in the transfer of multiple thin layers from the N-face, a polishing process can be used to reduce the fracture-induced roughness of the N-face and to remove residual subsurface lattice damage caused by ion implantation. The polish process can be a strictly mechanical process using a polish pad and a slurry comprising silica, alumina, SiC, diamond, or other slurry abrasive suspended in water as known in the art. Alternatively, the chemistry of the suspending fluid can be adjusted to enhance the polish rate and improve the polish uniformity. Such modification chemistries comprise KOH, NaOCl, or other chemicals known to controllably etch the N-face of GaN. The polish process is also applicable to the Ga-face of GaN. The polish process can be optimized to enable direct bonding of the N-face of GaN to the handle substrate. Optionally, the N-face can be planarized by reducing the roughness of the N-face of the GaN to an acceptable level with an initial polish followed by the deposition, densification, and polishing of a bonding layer material as is further described in the previous section. Such a bonding layer comprises $SiO_2$, $Si_3N_4$ or other material conveniently deposited and polished. The bonding layer should be thin following the polish process to allow subsequent ion implantation to create a damaged layer as the weak interface at a depth sufficient to allow removal of damage implantation damage and reduction of the surface roughness prior to growth. Preferably, the post-polish bonding layer has a roughness of <0.5 nm, a thickness of <200 nm, and the implantation-induced damaged layer is at a depth >500 nm from the GaN-bonding layer interface. By producing many thin transferred layers 12 from the same source wafer 10, the cost contribution of source wafer 10 per light-emitting semiconductor device can be reduced substantially. The present cost of commercially available high-quality low-defect-density freestanding GaN or AlN substrates is relatively high for use in manufacturing of high-brightness (HB) nitride semiconductor LEDs. The light-emitting device structure enabled according to the first embodiment of the invention (FIGS. 1 and 2H) reduces the cost contribution of source wafer 10 and enables economical production of much higher performance HB-LEDs as the direct benefit of using high-quality low-defect-density freestanding GaN or AlN substrates.

Similarly, for reusing sapphire source wafer in the transfer of multiple thin layers, a wet etch treatment can be used to reduce the fracture-induced roughness of the weak interface after exfoliation, to remove residual subsurface lattice damage caused by ion implantation, and to remove by lift-off any small remnants of the thin layer remaining on the source wafer. The wet etch treatment preferably uses heated chemical solutions containing phosphoric acid or more preferably a heated ortho-phosphoric solution sold under the trade name of Transetch-N®. The preferred temperature range of the heated chemical solution is 150° C. to 220° C. The preferred treatment time ranges from 10 minutes to 2 hours. Following the chemical treatment, a high temperature anneal of the sapphire source wafer in the atmosphere is preferred. As is known in the art, for example in pages 8-12 of "Wide Energy Bandgap Electronic Devices" by F. Ren and J. C. Zolper, a high temperature anneal of the sapphire wafer surface at 1380° C. for ~1 hour results in atomically flat surface on the sapphire wafer and readies the treated sapphire source wafer for reuse in the transfer of subsequent thin layer.

Damage Removal and Smoothing of Thin Transferred Layer

After exfoliation of the thin layer 12 from the source wafer 10, the surface at the weak interface 11 may be rough and may contain substantial lattice damage if ion implantation defined the weak interface 11. A smoothing or planarization step may be needed, comprising mechanical polishing, chemical mechanical polishing (CMP), or chemical etching of the surface of the thin transferred layer 12. High temperature thermal annealing is another option for smoothing the weak interface 11. As illustrated in FIG. 2H, the smoothing step removes surface damage and roughness and allows an improved surface 14 for subsequent epitaxial growth. Thus, an intermediate substrate 15 comprising the thin transferred layer 12 bonded to the handle substrate 20 is formed.

For thin transferred layer comprising GaN material, preferably the implantation damage on the Ga-face of the thin transferred layer in the weak interface 11 can be selectively removed after exfoliation of the thin transferred GaN layer 12 by using a wet chemical etch comprising a hot KOH: deionized water solution as disclosed in the earlier section on reusing source wafer. Using this etch, surfaces with a roughness below 1 nm are achieved. Furthermore, by using a very dilute solution, any threading dislocations present in the thin transferred layer would be preferentially etched at a slow enough rate to minimize formation of etch pits. Any etch pits formed would be very shallow with very low aspect ratio (<0.2). Preferably, the final thickness of the thin GaN layer should be 5 µm or less. More preferably, the final thickness of the thin GaN is between 50 and 1000 nm.

For thin transferred layer comprising sapphire material, preferably the implantation damage on the exposed surface at the weak interface 11 is removed after exfoliation of the thin transferred layer 12 by using inductively-coupled plasma reactive ion etching (ICP RIE) followed by wet chemical etch. With the following exemplary process parameters for an ICP RIE, a gas mixture of $BCl_3$ at 15 sccm and $Cl_2$ at 15 sccm, ICP power at 700 W, substrate power at 350 W, chamber pressure of 4 Pascal, and wafer chuck temperature at room temperature (20° C.), the implantation damage is controllably removed at 20~30 nm/minute of etch time. Depending on the initial thickness of the thin transferred layer immediately after transfer and the desired final thickness, an appropriate amount of sapphire including implantation damage can be removed. Preferably the final thickness of the thin sapphire layer should be 5 µm or less to prevent cracking and of the thin sapphire layer during subsequent thermal cycling. More preferably, the final thickness of the thin sapphire layer is between 50 and 1000 nm. After etch in ICP RIE, preferably a wet chemical etch is used to remove residual subsurface lattice damage caused by ICP RIE. The wet etch treatment preferably uses heated chemical solutions containing phosphoric acid or more preferably a heated ortho-phosphoric solution sold under the trade name of Transetch-N®. The preferred temperature range of the heated chemical solution is 150° C. to 220° C. The preferred treatment time ranges from 10 minutes to 2 hours. After the wet etch treatment, the improved surface 14 is ready for epitaxial growth.

Epitaxial Growth

In FIG. 2I, the active layers 30 of the light-emitting device structure are preferably epitaxially deposited in a metal-organic chemical vapor deposition (MOCVD) reactor or a molecular beam epitaxy (MBE) chamber. Other epitaxial techniques can also be used to deposit the active layers 30, for example HVPE. One specific example of active layers 30 comprises an n-type $Al_xGa_{1-x}N$ cladding 31, an $In_yGa_{1-y}N$ active region 32, a p-type $Al_zGa_{1-z}N$ cladding 33, and a p-type GaN contact 34. Many other designs are possible and known in the art. For example, the active layers 30 can be modified instead to comprise a p-type $Al_xGa_{1-x}N$ cladding 31, an $In_yGa_{1-y}N$ active region 32, an n-type $Al_zGa_{1-z}N$ cladding 33, and an n-type GaN contact 34. The active layers 30 can be further modified with additional layers near the $In_yGa_{1-y}N$ active region 32 to allow better carrier confinement or stronger wave guiding effects for application to laser devices. The $In_yGa_{1-y}N$ active region 32 can further incorporate single quantum well or multiple quantum wells to improve the performance of the light-emitting device. For light-emitting devices operating in the UV wavelength range, the thickness of the GaN contact 34 can be minimized to reduce internal absorption and to improve light-extraction efficiency. Furthermore, the thicknesses of the layers in the active layers 30 can be optimized to allow constructive interference in combination with reflected light from an optically-reflective first terminal contact 40 to improve light-extraction efficiency of the light-emitting device structure.

For intermediate substrate 15 comprising thin transferred sapphire layer, additional preparation steps during epitaxial growth would improve the quality of the active layers 30. Preferably, the MOCVD deposition of active layers 30 is preceded by a high temperature anneal in hydrogen (between 1000° C. to 1200° C.) for 5 to 20 minutes, a deposition of a thin layer of GaN at low temperature (500° C. to 700° C. with 10 to 100 nm nominal thickness), and a deposition of thick layer of GaN at normal growth temperature (1000° C. to 1100° C. with 0.5 μm to 5 μm nominal thickness). Alternatively, other preparation steps well known in the art of GaN growth on conventional bulk sapphire substrate can also be applied to the growth on the intermediate substrate comprising thin transferred sapphire layer according to the embodiments of the invention. Optionally, the growth surface of the thin transferred sapphire layer can be cleaned inside the MOCVD reactor by flowing HCl gas.

The quality of active layers 30 grown on wafer-bonded intermediate substrates can be improved dramatically. The wafer-bonded intermediate substrate has the potential to improve the crystalline quality of high-temperature epitaxial growth by providing efficient thermal coupling to the wafer susceptor in the growth process. Compared to conventional substrates such as sapphire, the Mo-based substrate will offer more effective radiative coupling to the wafer susceptor and will provide significantly better temperature control and temperature uniformity over the wafer surface. The use of an optically reflective handle substrate such as a Mo-based substrate, or an encapsulated single crystal substrate comprising GaAs or InP, will enable the use of commercially available in situ monitoring techniques as are known in the art, such as emissivity-corrected pyrometry. Access to such in situ monitoring techniques will enable improved control over critical growth parameters such as wafer temperature, relative to growth on optically transparent substrates such as sapphire for which such techniques are not readily available. Thus, one aspect of the invention provides a method in which properties of the intermediate substrate and/or the active layer(s) are optically monitored before and/or during the growth of the active layer(s). The optical monitoring comprises reflectance monitoring from a reflective handle substrate, such as emissivity-corrected pyrometry, and the property monitored may comprise the intermediate substrate temperature or other suitable properties. The method may also comprise controlling or changing the active layer growth parameters, such as the growth temperature of the wafer susceptor, furnace or other heating device(s) and/or the reactant flow rate(s), such as gas flow rate(s) in a CVD process.

The better match in CTE between GaN and Mo relative to GaN and sapphire also improves crystal quality by reducing wafer bow and stress during growth. The reduced wafer stress may minimize the creation of new crystal defects resulting from stress-induced plastic deformation during temperature excursions at elevated growth temperatures and wafer cool down. The thickness of the GaN buffer layer grown on conventional substrates comprising sapphire or SiC can be reduced substantially on the intermediate substrate according to the embodiments of the invention and results in cost savings from shorter growth time and less material consumed. The reduced wafer bow would allow higher uniformity in the grown active layers 30 in terms of layer thickness, material composition, and material strain by providing more uniform thermal contact between the substrate and the wafer susceptor. The higher growth uniformity would enable higher production yields and better reliability of the light-emitting devices according to the embodiments of the invention. Reduced wafer stress also eliminates the need for additional complicated buffer or interlayer structures incorporated into the epitaxial growth to prevent cracking or defect generation in the epitaxial layers during temperature excursions, such as the example described by S. Raghavan et al. in "Effect of AlN interlayers on growth stress in GaN layers deposited on (111) Si," Appl. Phys. Lett. 87, 142101 (2005).

Figure 11:
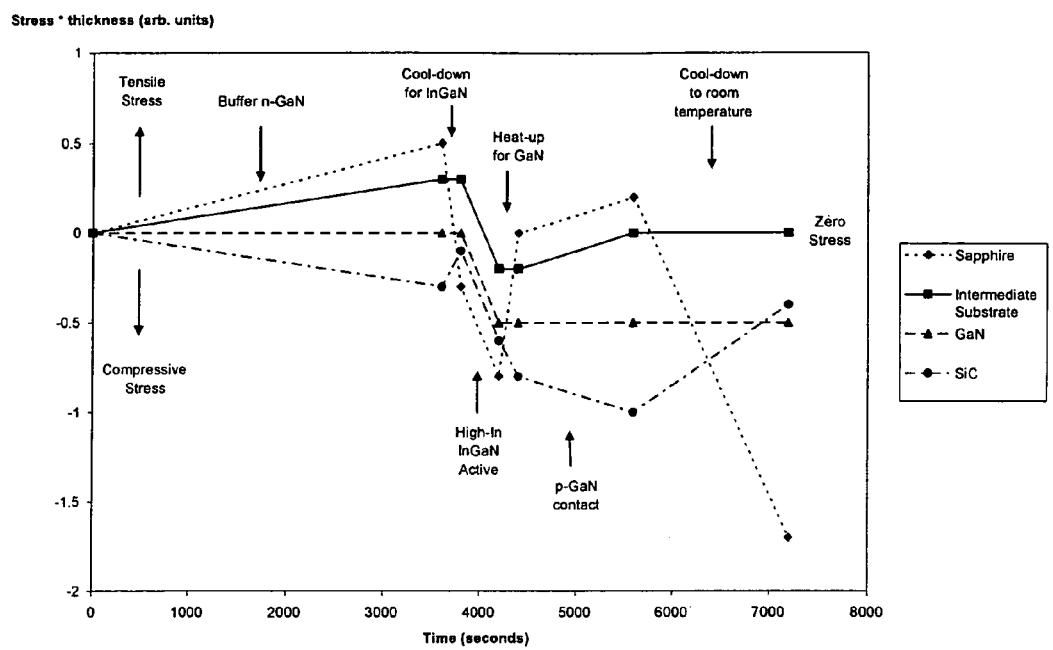
FIG. 11 is a plot of stress stress-thickness versus time of typical high-In InGaN active LED layers grown on the intermediate substrate according to an embodiment of the invention and of conventional substrates comprising sapphire, freestanding GaN, and SiC.

The better match in CTE between GaN and Mo relative to GaN and sapphire also simplifies the use of larger substrates in the device manufacturing process, resulting in significant cost reduction. The better match in CTE between GaN and Mo relative to GaN and sapphire simplifies the growth of In containing materials on the intermediate substrate comprising thin sapphire layer. It is known in the art that simultaneously achieving high In incorporation and excellent crystalline quality is extremely difficult in InGaN growth on conventional substrates comprising sapphire, SiC, or free-standing GaN templates. The difficulties result from the large lattice mismatch between InN and GaN, the InGaN composition pulling effect (see chapter C2 in "Properties, processing, and applications of Gallium Nitride and Related Semiconductors" edited by J. H. Edgar et al., 1999), and stress evolution during GaN growth on conventional substrates (see "Stress evolution during metalorganic chemical vapor deposition of GaN" by S. Hearne et al. in Appl. Phys. Lett. 74, 356 (1999)). The narrow and conflicting constraints imposed by each conventional substrate are widened or eliminated by the intermediate substrate comprising thin sapphire layer. Several curves of stress-thickness product plotted versus time of typical buffer GaN growths on various substrates including the intermediate substrate are shown in FIG. 11. Growth of InGaN material requires significantly lower growth temperature than GaN to increase incorporation of In, for example 500° C. to 850° C. It is also highly desirable for GaN to be under tensile stress during InGaN growth to decrease the difference in lattice constants between GaN and InGaN and to increase the incorporation of In. In addition, for uniform composition and thickness of InGaN material over an entire substrate, it is important to minimize the stress-thickness product at InGaN growth conditions to minimize wafer bow and resulting thermal non-uniformity. Based on FIG. 11, only the intermediate substrate according to the embodiments of the invention simultaneously meets these requirements for high quality InGaN growth and high In incorporation. High quality InGaN materials with high In incorporation enable the development of high-efficiency high-brightness III-nitride LEDs at longer wavelengths comprising colors of green, amber, and red that are critical for next-generation high-performance solid-state-lighting sources.

The reduced wafer stress from better CTE match offers much larger parameter space for the design of higher-performance active layers 30 grown on the intermediate substrate according to the embodiments of the invention. It is well known in the art that straining of the quantum wells in active layers 30 can improve the performance of the resulting device, for example reducing the threshold current or increasing the speed of the laser devices. The magnitude of the improvement is determined by the amount of strain. However, the maximum strain achievable in the quantum wells is fundamentally limited by material instability, generation of undesirable crystal defects, and the stress-thickness products during the growth and temperature excursions. For example in conventional III-nitride growth on bulk sapphire substrate, the allowable maximum strain is restricted simultaneously by CTE-induced tensile strain at growth temperature (for example 1050° C.) and compressive strain at lowest operational temperature of the device. These constraints are removed by the intermediate substrate according to the embodiments of the invention.

In addition to expanding the design space for the active layers, the reduced wafer stress from better CTE match also offers additional flexibility in applying higher Al composition materials for shorter-wavelength UV applications. The better CTE match maintains similar wafer stress levels at the high growth temperature and at room temperature. If the wafer stress level is slightly tensile at growth temperature, it will remain slightly tensile at room temperature. The stability in wafer stress level over large temperature excursions allows high-performance epilayer designs near the mechanical limits of the materials without compensating for thermally-induced strain. Device epilayers with higher compressive stress and higher Al-composition can be grown on the intermediate substrate according to the embodiments of the invention than epilayers demonstrated by J. Han et al. in "Monitoring and controlling of strain during MOCVD of AlGaN for UV optoelectronics" MRS Internet J. Nitride Semicond. Res. 4S1, G7.7 (1999).

Figure 9:
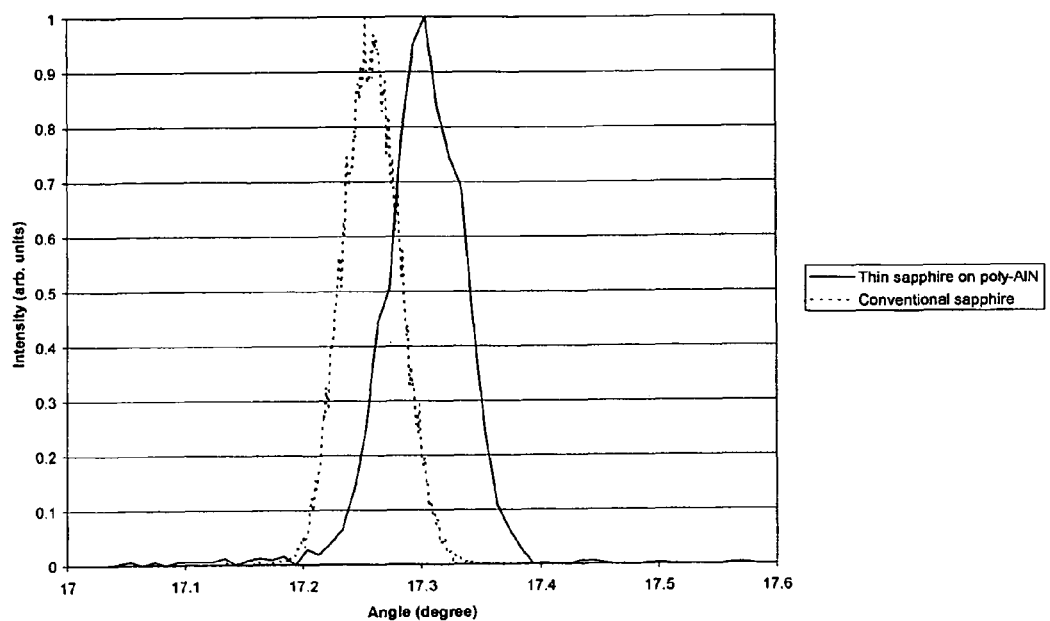
FIG. 9 is a diagram that shows the X-ray diffraction spectra of an epitaxial GaN layer grown on a thin sapphire layer on a poly-AlN handle substrate according to an embodiment of the invention.

To serve as an example, an epitaxial growth of GaN was performed on the intermediate substrate according to the embodiments of the invention comprising thin transferred sapphire layer and poly-crystalline AlN handle substrate. The epitaxial growth was performed in a horizontal-flow MOCVD reactor with radio-frequency (RF) heated wafer susceptor. The hydrogen anneal, low-temperature GaN, and thick GaN steps were performed and the resulting GaN material was analyzed. The x-ray diffraction spectrum of the GaN sample at room temperature is shown in FIG. 9 as a continuous curve. A reference GaN material grown on a conventional bulk sapphire substrate under similar growth conditions was also measured and shown as a dashed curve. The x-ray diffraction spectra demonstrate that the GaN grown on the intermediate substrate according to the embodiments of the invention is nearly stress free with calculated lattice constant very close to that of unstressed freestanding GaN material. Cross-sectional transmission electron microscopy (TEM) was also performed to analyze the defect microstructure of the GaN material, with an image shown in FIG. 10. In this image, the GaN layer is located at the top, thin sapphire layer in the middle, and part of the bonding layer at the bottom. The polycrystalline AlN handle substrate is not shown. The density of threading dislocation appears lower than GaN material grown under similar conditions on conventional bulk sapphire substrate. Although the thin sapphire layer has residual defects from implantation and transfer damages, the growth of the high-quality GaN layer was not adversely affected. This result shows that growth of high-quality GaN can occur even on imperfect sapphire transferred films or sapphire surfaces with less than perfect crystallinity.

Figure 10:
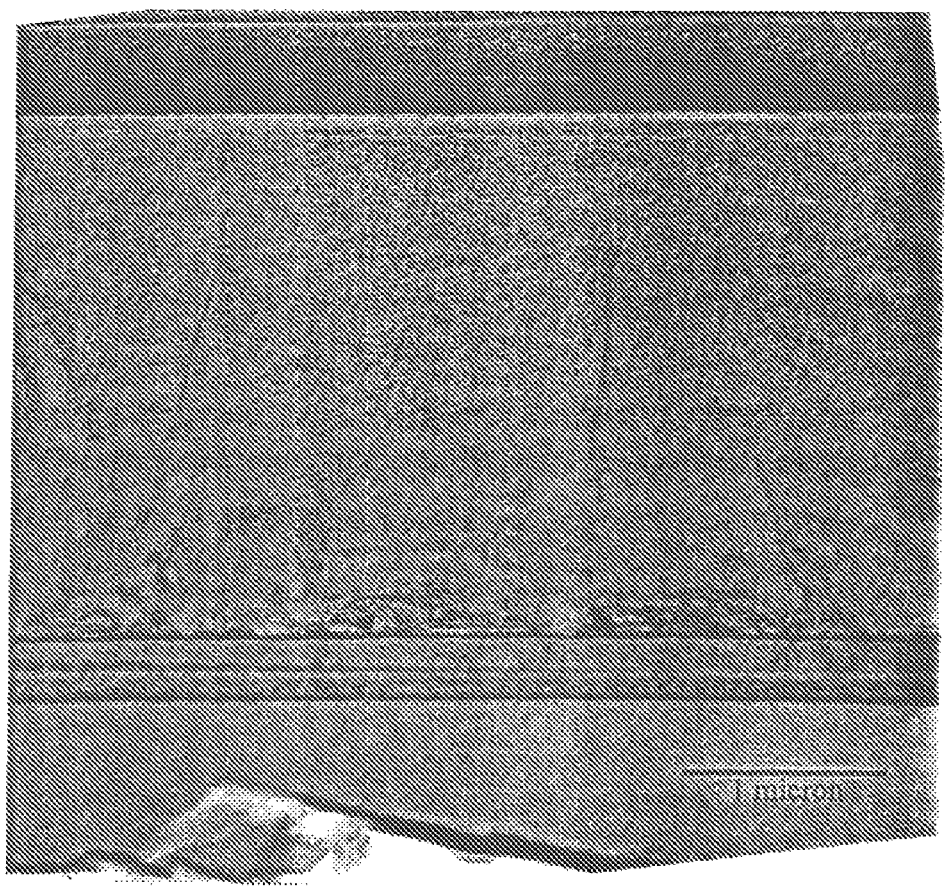
FIG. 10 is a cross-sectional TEM image of an epitaxial GaN layer grown on a thin sapphire layer on a poly-AlN substrate.

The thickness of the portion of the sapphire layer visible in FIG. 10 is about 300 nm. The sapphire layer thickness uniformity along the portion of its length visible in FIG. 10 appears to be about 3%. In other words, the film thickness along about 5 microns of its length varies by at about 3%. In general, the thin layer 12 made of sapphire or other materials (such as GaN, SiC, Si(111), etc.) may have a thickness uniformity along at least a part of its length, such as at least 5 microns of its length, that is less than 10%, such as 5% or less, for example 3-5%.

It may also be possible to use the metallic nature of the handle substrate to better control the wafer temperature in certain epitaxial reactors that employ RF heating. Specifically, it may be possible to use the RF generator in certain types of reactors to directly heat the handle substrate. By calibrating the heating of the substrate as a function of the RF power output, using, for example a pyrometer, it may be possible to achieve superior control of the temperature of the handle substrate and thin transferred layer. It may also be possible to modify the design of the reactor to increase the level of RF heating that occurs in the handle substrate.

In some implementations, the metallic nature of the handle substrate necessitates modifications to the growth parameters. In cases where the growth reactor uses RF generators for substrate heating and the handle substrate contains metal or other materials capable of converting RF power into heat, a reduced level of RF power will be required to heat the surface of the thin transferred layer to the desired temperature. As mentioned previously, this effect may be used to obtain better control over the temperature of the surface of the thin transferred layer.

Depending on the growth technique and specific recipe, it may be necessary to modify the growth process to account for the strain in the single crystal film resulting from the difference between the CTE of the single crystal film and the handle substrate material. Techniques for growing on strained films are well known and include the growth of linearly graded or step-graded buffer layers, in which the composition of the buffer layer is gradually adjusted throughout the thickness of the layer in order to minimize the formation of dislocations or other strain-induced defects.

In another embodiment to be described later in more detail, the intermediate substrates are used to produce high quality, freestanding GaN substrates rather than active device layers. A thick (preferably thicker than 100 micron) GaN layer is grown using MOCVD and/or HVPE on the thin transferred layer of a material suitable for the growth of GaN comprising GaN, sapphire, silicon carbide, or silicon. Preferably, the handle substrate is TZM for this application. Once the GaN layer reaches the target thickness, the handle substrate is preferably removed by the methods described below, and a freestanding GaN substrate is created.

The thick GaN layer is preferably grown by HVPE. More preferably the thick GaN layer is formed by MOCVD followed by HVPE where a thin nucleation layer with low temperature buffer layer (preferably <2 μm total) is deposited by MOCVD followed by a thick layer deposited by HVPE. This preferred combination of MOCVD with HVPE allows uniform nucleation of GaN from MOCVD and much higher growth rate (generally 10~100 μm/hr and higher) from HVPE to economically produce high-quality freestanding GaN substrates. The growth conditions for MOCVD nucleation layer has been described earlier in this section. HVPE growth is typically carried out in a quartz reactor within a multi-zone furnace. The growth zone temperature is set between 1000° C. to 1300° C. and the Ga source boat between 700° C. and 900° C. Gases of HCl and $NH_3$ flow over the Ga source to form GaCl and deposit GaN in the growth zone onto the intermediate substrate. The HVPE growth of GaN is well known in the art, see for example chapter 1 in "Wide Energy Bandgap Electronic Devices" by F. Ren and J. C. Zolper.

The freestanding GaN substrates produced with the intermediate substrate according to the embodiments of the invention offer several advantages over GaN substrates produced on conventional substrates such as sapphire. The CTE match of the intermediate substrate to GaN eliminates nearly all of the thermally-induced bowing, warping, and cracking problems that become more severe with larger diameter substrates. Necessity for high temperature laser-lift-off operation to minimize CTE-mismatch-induced cracking is also eliminated by utilizing the intermediate substrate.

Device Processing and First Contact

Optionally, as illustrated in FIG. 5A, an alternate photonic lattice structure can be formed by etching into the active layer 30 with reactive ion etching (RIE), inductively-coupled plasma reactive ion etching (ICP-RIE), or with other fabrication methods known in the art. This etch is preferably performed after the epitaxial deposition of the active layers 30. The etched areas 35 comprise patterns such as those illustrated in U.S. Pat. Nos. 5,955,749 and 6,479,371 or other patterns known in the art of photonic bandgap and periodic grating structures. Usually the dimensions of such patterns are on the order of the wavelength of the light to be emitted by the light-emitting device structure, adjusted by the refractive index of the materials used in the device structure. For the highest contrast in the refractive index, the etched areas 35 preferably extend through the active layer 30 into the thin layer 12. To simplify subsequent contact processing and to prevent electrical shorting, the etched areas 35 are preferably filled with electrically-insulating low-refractive-index dielectric material.

In FIGS. 2J and 5B, one or more metallic or metal-oxide films are deposited on top of active layers 30 to form a first terminal contact 40. The preferred composition depends on the specific material of the active layers 30. For active layers 30 comprising p-type GaN contact 34, Ni—Au is preferred as one component of the first terminal contact 40. For active layers 30 comprising n-type GaN contact 34, it is preferable to include Al, such as Ti—Al or W—Al for example, in the first terminal contact 40. In addition, the first terminal contact 40 preferably comprises optically-reflective layers and barrier layers, for example the omni-directional reflective structures as disclosed in U.S. Pat. Nos. 6,130,780 and 6,784,462, to provide for higher light-extraction efficiency and better stability and reliability of the light-emitting device.

Preferably, the optically-reflective layer comprises at least one element selected from the group of Ag, Ru, Os, Mo, Cr, Rh, Ni, Au, Pd, Ir, Ti, Pt, W, and Al. For example, optical reflectivities of Ag, Al, Rh, Cr, Pd, and Au at optical wavelengths around 500 nm are 91%, 92%, 75%, 69%, 69%, and 44% respectively. Therefore, Ag or Al are the most preferable materials with respect to reflectivity. However, it is preferable to employ Rh for good reflectivity, stability at high temperatures, and low resistance electrical contact to the p-type GaN contact layer 34. In addition, a transparent contact layer, for example ITO, can be incorporated into the optically-reflective layer directly adjacent to the GaN contact 34 to further improve the optical reflectivity at non-normal incidence angles in the manner known in the art. Furthermore, employing barrier layers within first terminal contact 40 formed of ZnO:Al, Au, Sn, Pd, Pt, In, Ti, Ni, W, Mo, Au—Sn, Sn—Pd, In—Pd, Ti—Pt—Au, and Ti—Pt—Sn, etc. placed on either or both sides of the optically-reflective layer can prevent inter-diffusion and alloying of the optically-reflective layer with surrounding materials that would cause deterioration in reflectivity and reduce light-extraction efficiency.

Final Substrate Preparation and Wafer Bonding

In FIG. 2K, the final or device substrate 50 is preferably thermally conductive which improves the thermal dissipation characteristics of light-emitting device structures according to the embodiments of the invention. The final substrate can also be electrically conductive to allow opposed terminal (i.e., vertical) structure. Materials for the final substrate 50 comprise single-crystalline, polycrystalline, and amorphous semiconductors such as SiC, Si, GaN, AlN, and ZnO, metallic elements (including alloys) such as CuW, W, Mo, and oxides and nitrides of metallic elements such as TiN. The specific choice of the final substrate 50 depends on the subsequent fabrication processes and specific design requirements. Three preferred materials for use in the nitride semiconductor embodiments as final substrate 50 are SiC, AlN, and CuW. SiC offers excellent thermal and electrical conductivity to allow high power operation of the light-emitting devices. AlN offers an excellent match of the thermal expansion coefficient to active layers 30. CuW offers close match of thermal expansion coefficient to active layers 30 and good thermal and electrical conductivity. Polycrystalline SiC, polycrystalline AlN, and CuW materials are relatively inexpensive and well suited for low-cost mass production.

As illustrated in FIGS. 2L and 2M, the intermediate substrate comprising the light-emitting device structure is wafer bonded to the final substrate 50 at the exposed surface of the first terminal contact 40. Preferably, a eutectic bonding layer 51 is provided on the final substrate 50, although the eutectic bonding layer can be provided instead on first terminal contact 40 or simultaneously on both final substrate 50 and the first terminal contact 40. The wafer bonding can be achieved by eutectic bonding with bonding layer 51, by direct covalent wafer bonding, or by other well-known techniques as disclosed in "Semiconductor Wafer Bonding" by Q.-Y. Tong and U. Göxsele. Low-temperature eutectic bonding is preferred. The eutectic bonding layer 51 comprises Au—Sn, Sn—Pd, In—Pd, and other compounds well known in the art. If Au—Sn is used, then the composition is preferably either approximately 80%-Au or 10%-Au for which the eutectic temperatures are approximately 280 C and 210 C respectively. Other compositions can also be selected based on their eutectic temperature, cost, CTE match with the final substrate, and their resistance to chemical attack during subsequent processing steps. The eutectic bonding layer can be provided by depositing a thin film multilayer stack of the component materials, for example alternate layers of Au and Sn, and/or by co-deposition of a single layer of the component materials, by sputtering, evaporation, electroplating, or other techniques known in the art. Preferably the total thickness of the deposited eutectic bonding layer is between 0.5 microns and 20 microns. Alternatively the bonding layer can be provided as a preformed eutectic solder disc as is commercially available. The thickness of the solder disc is preferably between 10 microns and 100 microns. Optionally an adhesion layer structure is provided on the top surface of the final substrate 50 and/or the exposed surface of the first terminal contact 40. If both an adhesion layer structure and a eutectic bonding layer are provided to either or both of the final substrate and the first terminal contact, then the adhesion layer is provided prior to the provision of the eutectic bonding layer and the eutectic bonding layer 51 is provided to the surface of the adhesion layer. Suitable adhesion layers comprise Ti/Pt/Au, Cr/Au, Ni/Au, Ni/Pt/Au, and other metallic multilayer structures as are known in the art. Alternatively the eutectic bonding layer is attached directly on the exposed surface of the first terminal contact 40 and/or the final substrate 50 if no adhesion layer is provided. In other words, an adhesion layer and/or a eutectic bonding layer may be provided on either or both of the final substrate 50 and the exposed surface of the first terminal contact 40.

In the case that the first terminal contact 40 is bonded to the final substrate 50 using a low-temperature eutectic bonding layer, then the bonding process comprises forming a prepared surface on both the first terminal contact and the final substrate, placing the prepared surfaces in contact to form a stack, heating the stack to a temperature higher than the eutectic temperature of the bonding layer, annealing the stack at that temperature, and cooling the stack back to room temperature. The prepared surface comprises an adhesion layer and/or a eutectic bonding layer as described above, but comprises at least one eutectic layer on at least one of the surfaces to be bonded. Preferably the annealing temperature is between 10 degrees C. and 100 degrees C. above the eutectic temperature of the eutectic alloy. The annealing time is selected to be sufficient to allow interdiffusion of the eutectic alloy components throughout the bonding layer and is between 10 seconds and 2 hours and is preferably between 30 seconds and 10 minutes. The bonding procedure can be performed on a hot plate, in a furnace, or in a wafer bonding apparatus equipped with a heater as is commercially available. Optionally the bonding process is performed in an inert gas or reducing environment in order to prevent oxidation of the bonding layer materials. Optionally an external pressure is applied to the stack during the annealing process.

Removal of the Handle Substrate and/or of the Entire Intermediate Substrate

In FIG. 2N, the handle substrate 20 and bonding layers 13, 21 are removed by etching using conventional techniques such as wet chemical etching, plasma etching, reactive-ion etching, inductively-coupled plasma reactive ion etching and other techniques known in the art. For the preferred embodiment of handle substrate 20 comprising Mo or TZM and final substrate 50 comprising CuW, a mixture of chemical etchants comprised of $HNO_3$ and $NH_4F$ in $H_2O$, preferably $HNO_3$:$H_2O$:$NH_4F$ (126:60:5), can be applied to remove the handle substrate 20 while leaving the final substrate 50 intact. The ratios of the three constituent chemicals of the etchant can be varied. If the handle substrate comprises polycrystalline AlN, suitable etchants include KOH, AZ400K photoresist developer, NaOH or other chemical solutions containing KOH or NaOH. Preferably, if the handle substrate is AlN, the etchant comprises KOH which is known to selectively etch AlN but does not etch W or Cu appreciably. More preferably for the case of an AlN handle substrate the etchant comprises an aqueous solution of KOH with a concentration between 20% and 70%. Optionally the etching solution for either AlN, or Mo or TZM handle substrates, can be heated to enhance the etch rate. Preferably the temperature of the etching solution is between 25° C. and 150° C.

In cases where the eutectic bonding layers 51 are susceptible to etching by the etching solution used in the handle substrate removal, a passivating layer can be provided to cover the exposed edges of the eutectic bonding layers. The passivating layer is provided after the final substrate has been bonded and before the handle substrate is exposed to the etching solution. Suitable passivating layer materials comprise spin on glass, photo resist, wax, ceramic pastes, and other materials selected for their chemical resistance, adhesion properties, ease of application, and cost.

The handle substrate can be thinned prior to the chemical etch removal process, using conventional grinding methods as are known in the art, in order to reduce the amount of time required for the chemical etching of the remaining handle substrate material. Preferably for a TZM or P-AlN handle substrate, the handle substrate is ground to a thickness of between 20 microns and 150 microns. The grinding can be accomplished using a fixed abrasive diamond, diamond slurry, or alumina slurry, or any combination of these abrasives or others known to those skilled in the art.

In addition, the $SiO_2$ bonding layers 13, 21 can be removed by HF etching solutions without significantly etching the device structure or final substrate. If the bonding layer comprises AlN then KOH can be used to selectively remove the bonding layer. For $Al_xGa_{1-x}N$ light-emitting devices operating in the UV wavelength range, the thin transferred layer 12 comprising GaN can also be removed to eliminate internal absorption and to improve light-extraction efficiency. Additionally, the preferred process for exfoliation of the GaN film causes point defects in the thin transferred GaN layer 12. While these point defects will not affect the quality of the light-emitting device grown on the thin transferred layer 12, the defects will degrade the electrical performance of the device. For that reason, even in devices that emit at a lower energy than the bandgap of GaN, removal of the thin transferred layer 12 from the light-emitting device is desirable. Optionally the handle substrate can be ground to a smaller thickness prior to etching, in order to decrease the duration of the etching process required for complete removal of handle substrate. Preferably the final thickness of the handle substrate after grinding is between 25 microns and 150 microns. If desired, the bonding layer(s) may be removed as sacrificial release layers by selective etching to separate the handle substrate 20 from the rest of the device. This way, the handle substrate 20 can be reused if desired.

For the case in which the handle substrate 20 is removed by chemical etching, a potential concern is contamination of the device surfaces with Cu and other trace metals released from the final substrate during the etch process. Contamination of the epitaxially grown device structure may occur by the dissolution of Cu or other potential contaminants from the handle substrate or the final substrate during chemical etching used to remove the handle substrate. Subsequently, these contaminants can redeposit on the exposed surface of the device structure or bonding layer following complete removal of the handle substrate. In subsequent thermal cycling any contamination on the surface of the device structure could potentially diffuse into the active region of the LED or LD structure. Such contaminants have the potential to dramatically reduce the performance of the finished device. To minimize the risk of degradation of the light-emitting device by contaminants originating in the final substrate, the final substrate and transferred active layer composite can be treated with a wet chemical process known to those skilled in the art designed to remove surface contaminants such as an $NH_4OH$:$H_2O_2$:$H_2O$ in a ratio of between 1:1:3 and 1:1:8 followed by a deionized water rinse. This treatment is performed prior to removal of the bonding layer. Optionally, a conformal protective film can be deposited on the exposed side of the final substrate prior to the chemical etching process to remove handle substrate. The protective film is selected for its chemical resistivity to the etching solution used to remove the handle substrate. By depositing a thin protective film by a separate step from the fabrication of the bulk final substrate, the chemical purity of the protective film can be better controlled with little impact on the material cost of the final substrate. So, the small quantity of the protective film that might be etched during the handle substrate removal presents no risk of contamination of the surface of the finished device. Materials suitable for use as a protective film are divided into conductive materials that may remain an integral component of the finished device and insulating films that can be conveniently removed following the removal of the handle substrate. A conductive protective film comprises W, but more broadly comprises any thermally and electrically conductive material that does not pose a contamination risk to the device and etches slowly (<0.1 µm min$^{-1}$) in the etchant used to remove the handle substrate. Insulating protective films comprise dielectrics commonly found in the semiconductor processing industry, including $Si_3N_4$, $SiO_2$, and $SiO_xN_y$, but more broadly comprise any material that does not pose a contamination risk to the device, etches slowly (<0.1 µm min$^{-1}$) in the etch used to remove the handle substrate, and can be conveniently removed following removal of the handle substrate by any number of processes including chemical etching, grinding, lapping, reactive ion etching, chemical mechanical polishing, or other film removal processes known to those skilled in the art. Both electrically conductive and insulating films can be deposited by sputtering, CVD, or electron-beam evaporation or other methods know to those skilled in the art. The desired thickness of the film is dependent upon the deposition method selected, but it should be sufficiently thick that there are no pinholes in the film that may contribute to contamination. Generally, films with thicknesses in excess of 0.1 µm or greater are sufficiently thick to prevent pinholes from penetrating through to the underlying surface. Further, the edges of the final substrate 50 can be beveled so that the deposition process covers all exposed surfaces and edges of the final substrate 50. To reduce costs, the final substrate with protective coatings can be pre-fabricated in mass quantities prior to the step in which the final substrate is bonded to the active layer device structure. Alternatively, by depositing the protective layer on the final substrate after bonding the final substrate to the active layer device structure and using a beveled final substrate, the bonded interface can be protected from any potential chemical attack during the etch of the handle substrate.

In the case where the thin transferred layer comprises GaN, following the removal of the handle substrate 20 and bonding layer(s) 13, 21, it may also be desirable to remove the thin GaN layer 12 that was originally bonded and transferred to serve as an epitaxial template for the LED device. This is desirable in the event that the processing used to bond, exfoliate, and prepare the thin GaN layer for epitaxy has lead to significant lattice damage that reduces the conductivity of the thin transferred GaN or other template layers. Alternatively, in the application of this method to UV LEDs, it is desirable to remove the thin GaN layer to avoid absorption of light emitted from the active region of the LED. The selective removal of the thin transferred GaN layer can be accomplished in several ways including, but not limited to, wet chemical etching, electrochemical etching, photochemical etching, photo-electrochemical etching, chemical mechanical polishing, dry etching with a halogen-containing plasma as known to those skilled in the art, or dry etch using a halogen-containing high-density plasma such as inductively-coupled plasma reactive ion etching (ICP RIE) process involving chlorine ($Cl_2$), boron trichloride ($BCl_3$), sulfur hexafluoride ($SF_6$), or carbon tetrafluoride ($CF_4$). If dry etch is used to selectively remove the thin transferred GaN layer, it is important to minimize ionic damage from the ion etching process. This can be accomplished by using low bias voltage to decrease the energy of the ions while maintaining acceptable etch rates. Preferably, bias voltage less than 400V is used. More preferably, bias voltage less than 100V is used. To improve production efficiency, a high-low etch technique can be used to quickly remove bulk of the thin GaN layer at high bias voltage and etch rate, and then reduce the etch rate and bias voltage of the plasma near the end of the etch to minimize ionic damage. High-density plasma etch techniques such as ICP RIE is especially favorable for selective removal of the thin transferred GaN layer. To improve the robustness of the process for removal of the thin transferred layer, it may be desirable to grow a thicker buffer layer on the GaN/Mo intermediate substrate in order to make the control of the etch depth and rate less critical to avoid damaging the active region of the device. In addition to selectively removing the thin transferred GaN layer, the generalized process described above can be applied to sapphire, SiC, Si(111), and other desirable materials for use as thin transferred layers for III-nitride growth. Alternatively, an additional sacrificial AlN or equivalent etch layer can be grown epitaxially between the thin transferred GaN layer 12 and active layers 30. Grooves comprising grid patterns are preferably formed into the thin transferred GaN layer by photolithography and reactive ion etching to locally expose the sacrificial AlN etch layer. A selective wet-chemical etch is preferably used to quickly remove the sacrificial etch layer by lateral etching and remove the thin transferred GaN layer by lift-off. The grooves accelerate the lateral etching process by reducing the lateral extent of etching required as compared to conventional full wafer lift-off process.

Photoelectrochemical (PEC) etching can also be applied to the precision removal of the thin transferred GaN layer with well-controlled etch depth and layer selectivity. An etch-stop layer can be grown inside the GaN buffer at a specific location. The etch stop layer would have wider bandgap than the photon energy of the photon source. Once the etching reaches the etch stop layer, the etch rate would reduce to zero due to the lack of photo-generated carriers available at the material surface. Stopping at the etch stop layer would allow light-emitting devices with precise thicknesses and optimized optical properties especially important for micro-cavity LED or vertical-cavity surface-emitting lasers (VCSEL). Some possible etching solutions for GaN comprise 1:3 (45%) KOH/$H_2O$ or 1:10 HCl/$H_2O$ solutions. Hg arc lamps or He—Cd lasers can be used as photon sources to activate the etching, see for example chapter B4.3 in "Properties, processing, and applications of Gallium Nitride and Related Semiconductors" edited by J. H. Edgar et al., 1999. AlGaN material with the appropriate bandgap can be inserted into the buffer GaN growth for use as an etch-stop layer.

In the case where the thin transferred layer comprises sapphire, following the removal of the handle substrate 20 and bonding layer(s) 13, 21, it may be desirable to remove all or portions of the insulating thin sapphire layer 12 that was originally bonded and transferred to serve as an epitaxial template for the LED device. The selective removal of the thin sapphire layer can be accomplished in several ways comprising wet chemical etching, chemical mechanical polishing, dry etching with a halogen-containing plasma as known to those skilled in the art, or dry etch using a halogen-containing high-density plasma such as inductively-coupled plasma reactive ion etching (ICP RIE) process involving chlorine ($Cl_2$), boron trichloride ($BCl_3$), sulfur hexafluoride ($SF_6$), and/or carbon tetrafluoride ($CF_4$). It is preferable to use dry etch to selectively remove the thin transferred sapphire layer. It is more preferable to apply an etch chemistry such as $CF_4$ and/or other F-based chemistry in ICP RIE that has similar etch rates in sapphire and GaN in order to maintain surface smoothness and planarity after removal of the thin sapphire layer.

A photoresist mask or other patterned mask may be applied before the etch to allow localized removal of the thin sapphire layer for making electrical contact while leaving other areas of thin sapphire layer intact. The portions of the remaining thin sapphire layer can serve as a passivation layer against external environmental contamination and/or moisture infiltration, eliminating the need for an additional deposition step to form a separate passivation layer comprising silicon nitride as is commonly required in conventional LED fabrication. It is known in the art that GaN devices are susceptible to high temperature degradation of p contact resistance induced by diffusion of moisture or hydrogen. The thin sapphire layer can act as a diffusion barrier to prevent the diffusion of undesirable species into the p-GaN contact and greatly improve the reliability of the fabricated device. The thin sapphire layer with refractive index of 1.77 can also act as an optical refractive-index-matching layer between GaN with refractive index of 2.5 and packaging materials comprising epoxy or silicone with refractive index of 1.38-1.57 to enhance light-coupling efficiency. Further patterning of the thin sapphire layer to form photonic lattice structure similar to the structure illustrated in FIG. 4 can also enhance the light-coupling efficiency of the fabricated device.

If dry etch is used to selectively remove the thin sapphire layer, it is important to minimize ionic damage from the ion etching process. This can be accomplished by using low bias voltage to decrease the energy of the ions while maintaining acceptable etch rates. Preferably, bias voltage less than 400V is used. To improve production efficiency, a high-low etch technique can be used to quickly remove bulk of the thin sapphire layer at high bias voltage and etch rate in a Cl-based chemistry, and then switch the etch chemistry to F-based plasma near the sapphire and GaN interface, and then switching the etch chemistry back to Cl-based plasma with reduced etch rate and bias voltage near the end of the buffer GaN etch to minimize residual ionic damage. High-density plasma etch techniques such as ICP RIE is especially favorable for selective removal of the thin transferred sapphire layer and the associated highly defective GaN buffer near the sapphire/buffer interface. To improve the robustness of the process for removal of the thin transferred layer, it may be desirable to grow a thicker buffer layer on the intermediate substrate in order to make the control of the etch depth and rate less critical to avoid damaging the active region of the device.

To further improve performance of the LED devices, it may be desirable to remove the GaN buffer layer (not shown) usually grown on the GaN/Mo intermediate substrate 15 prior to the growth of the active layers 30, in addition to removing the thin transferred GaN layer 12 to eliminate absorption of light emitted from the active region of the LED and to minimize thickness of the LED active region for better light extraction efficiency. It is known in the art that microcavity LEDs with higher light output can be created by preferably minimizing the total thickness of the LED active region to less than several wavelengths of the light and for blue-emitting LED to less than 0.5 μm. The GaN material can be removed similarly as described previously for removing the thin transferred GaN layer. The removal can be accomplished with any the techniques previously mentioned for the removal of thin GaN layer.

Alternatively, if desired, the handle substrate 20 and the thin layer 12 may be retained in the final device structure. In this case, the handle substrate can serve as the final device substrate of the completed device.

Device Processing and Second Contact

The following description applies to an embodiment of the invention where the thin transferred layer 12, here for example GaN, is not removed. If the thin transferred layer 12 was removed in prior processing steps, the following description would apply directly to the active layers 30 instead of the thin transferred layer 12. Although not shown in FIG. 2N, optionally patterning or roughening the thin transferred semiconductor layer 12 by etching or by other known methods can furher improve light-extraction efficiency of the light-emitting device according to the embodiments of the invention. The patterning or roughening increase the escape probability for light generated in the active layers 30. Some preferred examples for the patterning are to form a grating pattern on the thin transferred semiconductor layer 12 or to form a photonic lattice structure through the thin transferred semiconductor layer 12 and the active layers 30. The patterns can be formed with uniform or non-uniform striped shape, grid pattern, rectangular shape, or other engineered patterns such as those disclosed by US patent application no. 2005/0059179, U.S. Pat. Nos. 5,955,749, 6,479,371, and others known in the art of photonic bandgap and periodic grating structures. The patterns are preferably formed by standard holographic grating exposure followed by wet chemical etching or dry plasma etching. Other standard patterning techniques comprise electron-beam lithography, phase-mask lithography, x-ray lithography, natural lithography, etc. The periodicity of the patterns should preferably be on the order of the wavelength of light. The depth of the grating patterns should preferably be less than the thickness of the thin semiconductor layer 12 to prevent exposure and oxidation of active layers 30. For device structures with thin layer 12 already removed, the grating patterns should preferably be less than the thickness of the cladding layer 31. For photonic lattice structures, the patterns preferably extend through the thin semiconductor layer 12 into the active layers 30 to maximize the refractive-index contrast.

In FIG. 2O, one or more metallic or metal-oxide films are deposited on the thin transferred semiconductor layer 12 to form a second terminal contact 60. The preferred composition depends on the specific material of the thin transferred semiconductor layer 12. For thin transferred semiconductor layer 12 comprising p-type GaN, Ni—Au is preferred as one component of the second terminal contact 60. For thin transferred semiconductor layer 12 comprising n-type GaN, it is preferable to include Al, such as Ti—Al or W—Al for example, in the second terminal contact 60. Second terminal contact 60 does not necessarily have to cover the entire surface of thin transferred semiconductor layer 12 comprising n-type GaN. This reduces the light-blocking area and improves light-extraction efficiency. In addition, the second terminal contact 60 preferably comprises optically-reflective layer to provide for higher light-extraction efficiency of the light-emitting device. Alternatively, a transparent contact, for example ITO or ZnO:Al, can also be used as second terminal contact 60. The transparent contact would allow large current flow without high spreading resistance in either p-type or n-type semiconductor.

Completed Device

Specific embodiments of completed light-emitting devices according to the embodiments of the invention are illustrated in FIGS. 1, 4, and 6. The arrows in the figures indicate the preferred direction for light output. FIG. 1 shows a preferred light-emitting device according to an embodiment of the invention produced by processing steps illustrated in FIGS. 2A-2O. FIG. 4 shows another preferred light-emitting device comprising photonic lattice structure produced by combining processing steps illustrated in FIGS. 2A-2O and FIGS. 3A-3C. FIG. 6 shows yet another preferred light-emitting device comprising photonic lattice structure produced by combining processing steps illustrated in FIGS. 2A-2O and FIGS. 5A-5B.

The semiconductor light-emitting device as described has unique advantages. The cost per light-emitting device of the source wafer material is reduced significantly via reuse of expensive high-quality source wafers. The quality of the substrate material is improved by three or more orders of magnitude as compared to those used for conventional LED production (reduction of $10^3$ in dislocation-defect density, for example from $10^9/cm^3$ to $10^6/cm^3$). This improvement in material quality enables the subsequent growth of device layers with high material quality. These high material quality device layers are capable of supporting significantly higher levels of current density than device layers typically grown on sapphire substrates. These higher current density levels lead to higher light output per unit area of the processed wafer. Because many manufacturing costs are closely linked to area of the wafer being processed, the higher light output per unit area translates into higher light output per manufacturing dollar. In summary, the simultaneous improvement in production cost and material quality enables the development of cost-effective solid state lighting sources with very high brightness. More light can be produced by smaller-area devices, thereby improving effective light output power per unit area of semiconductor while reducing the cost per watt of light output and improving long-term reliability.

The incorporation of grating and reflective layer into the light-emitting device structure after active layer epitaxial growth minimizes high-temperature thermal cycling of these delicate structures. All of the time consuming, low yield, and high cost steps used in conventional LED production, such as flip-chip mounting, laser lift-off of sapphire substrate, transfer of unsupported thin-film active devices have been eliminated by the light-emitting device of this invention. The active layer epitaxial growth occurs after the thin transferred semiconductor layer and handle substrate are completely bonded and mechanically robust. The delicate active layers containing highly strained materials are not subjected to extraneous thermal stresses and mechanical stresses from high-temperature wafer bonding steps or other manipulations that can significantly degrade the performance and reliability of the semiconductor light-emitting device.

Compared to conventional light-emitting devices grown on sapphire, the usable area of light-emission in the light-emitting devices according to the embodiments of the invention is increased significantly by eliminating one contact on the top surface. Lateral current flow through the chip and resulting excess heat are also eliminated by the light-emitting devices according to the embodiments of the invention.

For light-emitting devices comprising thin sapphire layer on intermediate substrate according to the embodiments of the invention, portions of the thin sapphire layer can serve as a passivation layer against external environmental contamination and/or moisture infiltration, prevent diffusion of undesirable species into the p-GaN contact, and greatly improve the reliability of the completed light-emitting device.

The better match in CTE between GaN and the intermediate substrate according to the embodiments of the invention improves crystal quality by reducing wafer bow and stress during growth. The reduced wafer bow would allow better uniformity between devices fabricated from each wafer. The better uniformity and consistency would enable higher production yields and better reliability of the light-emitting devices.

The better CTE match also improves In containing materials grown on the intermediate substrate comprising thin sapphire layer according to the embodiments of the invention. High In incorporation and excellent crystalline quality can be achieved, enabling the development of high-efficiency high-brightness III-nitride LEDs at longer wavelengths comprising colors of green, amber, and red that are critical for next-generation high-performance solid-state-lighting sources.

The reduced wafer stress from better CTE match offers much larger parameter space for the design of higher-performance active layers that would reduce the threshold current or increase the speed of the light-emitting devices. The better CTE match also offers additional flexibility in applying higher Al composition materials necessary for light-emitting devices applied to shorter-wavelength UV applications.

Alternative Embodiments

In an alternative second embodiment, rather than bonding a III-nitride semiconductor source wafer 10 to the handle substrate and then exfoliating a thin III-nitride semiconductor layer 12 from the semiconductor source wafer, a single-crystalline material which supports epitaxial growth of III-nitride semiconductor layers is bonded to the handle substrate. This single-crystal material comprises sapphire, silicon carbide or any other suitable material which supports epitaxial growth of III-nitride semiconductor layers such as GaN, InGaN, AlGaN, etc. Thus, the GaN substrate 10 shown in FIG. 2A is substituted with a single-crystalline material comprising sapphire, SiC, or other ceramic materials.

A thin transferred layer 12 from a single-crystal material such as sapphire, may be formed on the handle substrate using an ion implantation-induced exfoliation from a bulk substrate, as shown in FIGS. 2A-2H, or using a substrate bond and etch-back process (i.e., etching and/or polishing away the single-crystalline material to leave only a thin layer of the single-crystalline material bonded to the handle substrate), or using a lateral etch of a weakened interface 11 generated by ion implantation. One or more III-nitride semiconductor layers 31-34, such as GaN, InGaN, etc., which make up the light-emitting device are then epitaxially grown over the thin layer 12 of single-crystalline material, such as sapphire, while this thin layer 12 is bonded to the handle substrate 20. Further processing of this alternative second embodiment is similar to the process steps already shown in the Figures and described above.

In this case, the handle substrate 20 would be comprised of a material that is better CTE matched to III-nitride semiconductors (i.e., GaN, etc.) than the single-crystalline source wafer, such as sapphire, and which may possess a higher thermal conductivity than sapphire. Because the thickness of the sapphire film would be small relative to the thickness of the handle substrate 20, the overall CTE of the completed intermediate substrate 15 would be closely matched to III-nitride semiconductor layers, such as GaN. For example, the CTE of the intermediate substrate comprising the handle substrate 20 covered with a thin layer 12 of the single-crystalline material, such as sapphire, would differ by 20% or less, such as 10% or less, from the CTE of the III-nitride semiconductor layer(s) 31-34.

In addition, assuming the handle substrate 20 could be easily removed, it will be easier to remove the remaining thin layer 12 after growth of a GaN device layer(s) 31-34 relative to the case where a bulk sapphire wafer was used to form a conventional III-nitride light-emitting device. An intermediate substrate 15 comprising thin sapphire layer of the second embodiment would possess some of the advantages of the intermediate substrate comprising thin GaN layer of the first embodiment when compared to a conventional bulk sapphire substrate. Specifically, the better CTE match of the thin sapphire layer on handle substrate 20 to the III-nitride active layers as compared to a conventional bulk sapphire substrate would reduce the bowing and resultant thermal variation across the substrate during GaN growth, resulting in improved device uniformity. In addition, it will be easier to create front side contacts through the removal of the insulating thin sapphire layer 12 following device growth. However, at the same time, the GaN device structures grown on the intermediate substrate comprising thin sapphire layer of the second embodiment would still suffer from the lattice-mismatch-induced dislocations that are a part of any heteroepitaxial III-nitride growth process on sapphire. Optionally, silicon carbide or other ceramic materials could be used in the place of sapphire.

One additional benefit of this second embodiment relative to the first is that the source wafers for the second embodiment are available in larger sizes than the freestanding GaN of the first embodiment. Consequently, it may be possible to manufacture substrates with larger diameter according to the second embodiment than the first. In the case where the thin layer 12 is sapphire and the handle substrate 20 is an alloy of molybdenum, it is possible to manufacture 75, 100, 150 mm and larger substrates. Larger wafer sizes offer economy of scale and help device manufacturers to reduce their production costs per device.

It should be noted that the thin transferred single-crystalline layer may be mis-cut from the primary crystallographic orientation, for example (0001) for III-nitride growth. In the case where the thin transferred single-crystalline layer is sapphire, this mis-cut is typically between 0° and 0.3°. In the case where exfoliation or bond and etch back processes are used to transfer the thin single-crystalline layer on the handle substrate, the mis-cut in the thin transferred single-crystalline layer can be achieved by using a mis-cut source wafer. In cases where mis-cut source wafers are not readily available, it is possible to deposit a thin layer of material with a non-zero stopping power on the source wafer and then polish it so that its thickness varies across the surface of the wafer. In this case, the thickness variation is established so that the implanted ions reach planar but off axis depths in the source wafer so that a thin mis-cut layer can be transferred from the source wafer.

It is also possible to use non-standard crystallographic orientations of material as the source wafer for the thin single-crystalline layer. In the case where the material is sapphire, the source wafer may be of the R-plane variety. The resulting GaN growths on the intermediate substrate comprising thin single-crystalline layer from this substrate can produce non-polar GaN materials, according to techniques described by Li Dong-Sheng et al in 2004 Chinese Phys. Lett. 21 970-971 and other published results.

In a third embodiment, an epitaxially-grown layer on a source wafer 10 can be bonded to the handle substrate 20. Preferably, the epitaxially-grown layer on a source wafer 10 comprises a film of AlGaN grown epitaxially on a sapphire or SiC substrate, using techniques known in the art such as HVPE, MOCVD or MBE. In this embodiment the GaN source wafer 10 in FIG. 2A is substituted with an epitaxially-grown layer on a substrate comprising an $Al_xGa_{1-x}N$ layer on a SiC or sapphire substrate, such that a thin layer of the $Al_xGa_{1-x}N$ layer, where $0 \leq x \leq 1$, is bonded and transferred to the handle substrate.

A thin transferred layer 12 of the epitaxially-grown AlGaN film may be formed on the handle substrate 20 using exfoliation or a substrate bond and etch-back process. Further processing of this third embodiment is similar to the process steps already shown in the Figures and described above.

In a fourth embodiment, the intermediate substrates are used to produce high quality, freestanding GaN substrates rather than active device layers. In one implementation of this embodiment, a thin single-crystalline layer of GaN is transferred from an existing freestanding GaN source wafer. A thick (preferably >50 micron, and more preferably >100 micron) GaN layer is then grown on the thin transferred single-crystalline layer using MOCVD or HVPE. Preferably, the handle substrate is TZM for this application. Once the GaN layer reaches the target thickness, the handle substrate is removed. By beginning the freestanding GaN growth process with a high quality, thin single-crystalline layer of GaN, it may be possible to reach higher levels of material quality than can be achieved through standard epitaxial approaches.

In another implementation of the fourth embodiment, that is similar to the second embodiment described above, a thin single-crystalline layer of a material suitable for the growth of GaN is bonded to a handle substrate. The thin single-crystalline layer comprises sapphire, silicon carbide, or silicon, but is preferably sapphire. The thin transferred single-crystalline layer then becomes the seed layer for the growth of a thick layer of GaN. In one implementation, this technique may be combined with lateral overgrowth techniques including, but not limited to, epitaxial lateral overgrowth and pendeoepitaxy, in order to generate higher quality GaN. Once a target thickness is reached, the handle substrate is easily removed by any of the processes mentioned previously. Once the handle substrate is removed, the thin single-crystalline layer is also removed through any of the associated processes mentioned previously. This approach has a number of advantages over existing techniques for producing freestanding III-nitride substrates via heteroepitaxy on sapphire substrates. In particular, in the case where the thin transferred single-crystalline layer is sapphire and the handle substrate is an alloy of molybdenum, the CTE match of the intermediate substrate to GaN is sufficiently close so as to enable the growth of thick GaN films without deleterious bowing and cracking even at large substrate sizes. As a result this technique enables the growth of larger freestanding III-nitride substrates than could be produced by heteroepitaxial growth on bulk sapphire substrates.

In another implementation of the fourth embodiment that is similar to the third embodiment described earlier, a thin single-crystalline layer of epitaxial GaN grown by heteroepitaxy is transferred onto a handle substrate. The epitaxial GaN may be grown on any substrate that is suitable for the growth of GaN, including, but not limited to, sapphire, silicon carbide, and silicon(111). The transferred single-crystalline layer then becomes the seed layer for the growth of a thick layer of GaN. Once a target thickness is reached, the handle substrate is easily removed and the thick layer of GaN becomes free standing. This approach has a number of advantages over existing techniques for producing freestanding substrates via heteroepitaxy on sapphire substrates. By transferring a thin GaN layer grown in a separate process, the nucleation and growth of a freestanding GaN substrate by HVPE or any other suitable method of thick epitaxy required in the fabrication of a freestanding GaN substrate will be improved by reducing the difficulty of nucleation and initiation of GaN growth by switching the growth from heteroepitaxy in the case of GaN on sapphire to homoepitaxy.

While particular embodiments comprising LED devices have been shown and described, the methods described herein can also be applied advantageously to laser diodes and III-nitride based transistors, such as high electron mobility transistors (HEMT) as described in "Wide Energy Bandgap Electronic Devices" by F. Ren and J. C. Zolper and heterostructure bipolar transistor (HBT) as described in "GaN HBT: Toward an RF Device" by L. S. McCarthy et. al. IEEE Transaction on Electron Devices, Vol. 48, No. 3, March 2001. These devices may be used in RF and microwave circuits.

HEMTs find their use in microwave circuit applications, such as in microwave monolithic IC's (MMICs). The transistor behaves much like conventional Field Effect Transistor (FET). A conducting channel between drain and source electrodes can be affected by applying a voltage to the gate electrode. This causes modulation of the drain-source current. In a HEMT, the conducting channel is created by a heterostructure which confines the charge carriers to a thin layer. The heterostructure may comprise an AlGaN/GaN or an InAlN/GaN heterostructure, for example. The gate electrode is formed above the heterostructure channel while source and drain regions abut the heterostructure channel.

HBTs find their use in RF circuits. In a HBT, a heterojunction exists in its npn or pnp collector/base/emitter structure. Thus, the HBT may comprise an AlGaN/GaN heterostructure including an n++ GaN subcollector, an n+ GaN collector, a p+ GaN base, an n– GaN spacer, an n+ AlGaN emitter and an n++ AlGaN emitter cap.

The LED active layers 30 can be substituted with the appropriate device layer structure known in the art for the transistors, such as HEMT or HBT. The intermediate substrate shown in FIG. 2H allows growth of high quality epitaxial material. The high-quality epitaxial material can be transferred to a final device substrate chosen to optimize performance of the electronic device in specific applications, such as high speed or high power applications. For example, the preferred final device substrate for high-speed HEMT comprises thermally conductive and electrically insulating materials such as insulating polycrystalline AlN or SiC, since HEMTs generally comprise lateral devices (i.e., with electrodes on top of the device). On the other hand, the preferred final device substrate for high-power HBT comprises thermally conductive and electrically conductive materials similar to those materials selected for LEDs, since HBTs are preferably vertical devices with one (i.e., collector) contact contacting the conductive substrate and the other (i.e., emitter) contact contacting the top of the device, such as the emitter cap. The fabrication and contact processing steps for the active layers of these electronic devices are well known in the art. Electronic devices of much higher performance can be fabricated from the high quality epitaxial material and optimized final device substrate according to the embodiments of the invention.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention. All patents, published applications and articles mentioned herein are incorporated by reference in their entirety. The following U.S. provisional applications are incorporated herein by reference in their entirety: 60/654,523, filed Feb. 18, 2005 and 60/657,385 filed Mar. 2, 2005.

The invention claimed is:

1. A method of making a substrate, comprising:
providing a sintered polycrystalline material handle substrate comprising a diffusion barrier layer which prevents diffusion of a sintering material out of the sintered polycrystalline material of the handle substrate, wherein the diffusion barrier layer of silicon nitride or amorphous silicon carbide substantially encapsulates a top surface and a side surface of the handle substrate;
transferring a thin single crystal layer of a first material which is suitable for epitaxial growth of a single crystal III-nitride semiconductor layer onto the handle substrate having a CTE which is closely CTE matched to a CTE of the III-nitride semiconductor layer;
epitaxially growing a thick single crystal III-nitride semiconductor layer on the thin single crystal layer of the first material; and
removing the handle substrate.

2. The method of claim 1, further comprising removing the thin single crystal layer of the first material such that the thick single crystal III-nitride semiconductor layer forms a freestanding single crystal III-nitride substrate having a thickness of greater than 100 microns.

3. The method of claim 1, wherein the transferring a thin single crystal layer comprises:
forming a weak interface in a GaN source substrate by implanting ions into an N-terminated surface of the GaN source substrate;
bonding the N-terminated surface of the GaN source substrate to the handle substrate; and
exfoliating a thin GaN single crystal layer from the source substrate such that the thin GaN exfoliated single crystal layer remains bonded to the handle substrate and a Ga-terminated surface of the thin GaN single crystal layer is exposed.

4. The method of claim 1, wherein the handle substrate comprises polycrystalline aluminum nitride.

5. The method of claim 1, wherein the thin single crystal layer comprises a single crystal GaN, SiC, or Si(111) layer.

6. The method of claim 1, wherein the handle substrate comprises polycrystalline aluminum nitride and the sintering material comprises yttria.

7. The method of claim 1, wherein the handle substrate comprises polycrystalline aluminum nitride and wherein the diffusion barrier layer comprises a layer of silicon nitride or amorphous silicon carbide located between the polycrystalline aluminum nitride and the thin single crystal layer of a first material.

8. The method of claim 1, wherein the handle substrate further comprises a bonding layer such that the diffusion barrier layer is located between the bonding layer and the sintered polycrystalline material.

9. The method of claim 1, wherein during the step of epitaxially growing a thick single crystal III-nitride semiconductor layer on the thin single crystal layer of the first material, the diffusion barrier covers all exposed surfaces of the handle substrate.

10. A method of making a substrate, comprising:
providing a sintered polycrystalline material handle substrate comprising a diffusion barrier layer of silicon nitride, silicon oxi-nitride, aluminum nitride, aluminum oxi-nitride, alumina or silicon carbide substantially encapsulates a bonding surface of the handle substrate and a side surface or a bottom surface of the handle substrate which prevents diffusion of a sintering material out of the sintered polycrystalline material of the handle substrate;
transferring a thin single crystal layer of a first material which is suitable for epitaxial growth of a single crystal III-nitride semiconductor layer onto the handle substrate having a CTE which is closely CTE matched to a CTE of the III-nitride semiconductor layer;
epitaxially growing a thick single crystal III-nitride semiconductor layer on the thin single crystal layer of the first material; and
removing the handle substrate, wherein, prior to the step of transferring the single crystal layer, the handle substrate further comprises a bonding layer such that the diffusion barrier layer is located between the bonding layer and the sintered polycrystalline material.

11. The method of claim 10, wherein:
the step of transferring the single crystal layer comprises:
  forming a weak interface in a source substrate;
  contacting the source substrate to the handle substrate;
  bonding the source substrate to the handle substrate; and
  exfoliating the thin single crystal layer from the source substrate such that the thin exfoliated single crystal layer remains bonded to the handle substrate;
wherein, prior to contacting the source substrate to the handle substrate, the handle substrate comprises a bonding layer such that the diffusion barrier layer is located between the bonding layer and the sintered polycrystalline material.

12. A method of making a substrate, comprising:
providing a sintered polycrystalline material handle substrate comprising a diffusion barrier layer of silicon nitride, amorphous silicon carbide, alumina, aluminum nitride, or titanium nitride substantially encapsulating a top surface and at least a portion of a side surface or a bottom surface of the handle substrate which prevents diffusion of a sintering material out of the sintered polycrystalline material of the handle substrate;
transferring a thin single crystal layer of a first material which is suitable for epitaxial growth of a single crystal III-nitride semiconductor layer onto the handle substrate having a CTE which is closely CTE matched to a CTE of the III-nitride semiconductor layer;
epitaxially growing a thick single crystal III-nitride semiconductor layer on the thin single crystal layer of the first material; and
removing the handle substrate.

13. The method of making a substrate of claim 12, wherein the diffusion barrier layer substantially encapsulates the top surface, the side surface and the bottom surface of the handle substrate.

* * * * *